(12) United States Patent
Peddecord et al.

(10) Patent No.: US 10,101,637 B2
(45) Date of Patent: Oct. 16, 2018

(54) CAMERA CASE WITH REMOVABLE CARRIER, FILTER RECEIVER, EXTERNAL BATTERY AND SUPPLEMENTAL MEMORY STORAGE

(71) Applicant: Avant Technology, Inc., Pflugerville, TX (US)

(72) Inventors: Tim Peddecord, Austin, TX (US); Justin M. Goodwin, Austin, TX (US); Paul M. Goodwin, Cedar Park, TX (US)

(73) Assignee: Avant Technology, Inc., Pflugerville, TX (US)

( * ) Notice: Subject to any disclaimer, the term of this patent is extended or adjusted under 35 U.S.C. 154(b) by 0 days.

(21) Appl. No.: 15/261,804

(22) Filed: Sep. 9, 2016

(65) Prior Publication Data
US 2017/0078537 A1    Mar. 16, 2017

Related U.S. Application Data

(60) Provisional application No. 62/217,496, filed on Sep. 11, 2015.

(51) Int. Cl.
   *G03B 17/08*   (2006.01)
   *H05K 5/06*    (2006.01)
   (Continued)

(52) U.S. Cl.
   CPC ........... *G03B 17/08* (2013.01); *H04N 5/2252* (2013.01); *H04N 5/2254* (2013.01); *H05K 5/06* (2013.01); *G03B 17/56* (2013.01)

(58) Field of Classification Search
   None
   See application file for complete search history.

(56) References Cited

U.S. PATENT DOCUMENTS

| 3,026,784 A | 3/1962 | Byers |
| 3,668,986 A | 6/1972 | Lemaire |

(Continued)

OTHER PUBLICATIONS

Cyclingnews.com; Interbike Show—Las Vegas, Nevada, USA Sep. 22-26, 2008, Interbike bits and baubles, Part 19, Oct. 21, 2008.

(Continued)

*Primary Examiner* — Justin P. Misleh
(74) *Attorney, Agent, or Firm* — Hemingway & Hansen, LLP; D. Scott Hemingway

(57) ABSTRACT

The present invention is a supplemental waterproof housing that completely surrounds a camera device, and it encloses an integrated and removable supplemental external battery and supplemental memory storage inside the external housing, and provides for a mounting point for lenses, filters or adaptors and handles attached to outside to the external housing. The internal compartment of the housing encloses an inner housing that holds the camera, and allows easy connections to the removable memory chips and removable battery packs through coupling adapters, connectors and bridges, which is all integrated into and enclosed by the external housing. The present invention also allows access to the internal compartment with one side of the inner housing providing a seal on one side of the waterproof housing, which is secured through waterproof seals, couplings and latches on the outside of the housing.

18 Claims, 44 Drawing Sheets

(51) Int. Cl.
  *H04N 5/225* (2006.01)
  *G03B 17/56* (2006.01)

(56) References Cited

U.S. PATENT DOCUMENTS

| | | | |
|---|---|---|---|
| 4,071,066 A | 1/1978 | Schaeffer | |
| 4,771,299 A | 9/1988 | Gell, Jr. | |
| 5,087,934 A | 2/1992 | Johnson | |
| 5,239,323 A | 8/1993 | Johnson | |
| 5,294,988 A | 3/1994 | Wakabayashi et al. | |
| 5,512,969 A | 4/1996 | Harris | |
| 5,541,682 A | 7/1996 | Petruchik et al. | |
| 5,563,661 A | 10/1996 | Takahashi et al. | |
| D411,217 S | 6/1999 | McBride | |
| 5,969,750 A | 10/1999 | Hsieh et al. | |
| 6,064,824 A | 5/2000 | Rink | |
| 6,097,424 A | 8/2000 | Zernov et al. | |
| 6,138,826 A * | 10/2000 | Kanamori | A45C 11/38 206/316.2 |
| 6,476,853 B1 | 11/2002 | Zernov et al. | |
| 6,480,671 B2 | 11/2002 | Takahashi et al. | |
| 6,574,433 B1 | 6/2003 | Stuempfl | |
| 6,784,920 B2 | 8/2004 | Weber | |
| D496,674 S | 9/2004 | Hayashi | |
| D504,904 S | 5/2005 | Nagai et al. | |
| 7,522,834 B2 | 4/2009 | Heaven et al. | |
| 7,612,821 B1 | 11/2009 | Hsia | |
| 7,679,674 B2 | 3/2010 | Nishizawa | |
| 8,013,932 B2 | 9/2011 | Chan | |
| D646,313 S | 10/2011 | Woodman | |
| D647,554 S | 10/2011 | Yim | |
| 8,123,420 B2 | 2/2012 | Gottwald et al. | |
| D657,808 S | 4/2012 | Woodman | |
| D657,811 S | 4/2012 | Woodman | |
| D659,733 S | 5/2012 | Chen | |
| 8,189,098 B2 | 5/2012 | Maruyama et al. | |
| 8,199,251 B2 | 6/2012 | Woodman | |
| 8,325,270 B2 | 12/2012 | Woodman | |
| 8,437,630 B2 | 5/2013 | Wessner | |
| 8,638,392 B2 | 1/2014 | Woodman | |
| D702,747 S | 4/2014 | Woodman et al. | |
| 8,792,050 B2 | 7/2014 | Shinohara et al. | |
| D710,921 S | 8/2014 | Gioscia et al. | |
| D710,922 S | 8/2014 | Gioscia et al. | |
| 8,837,928 B1 | 9/2014 | Clearman et al. | |
| D725,169 S | 3/2015 | Gioscia et al. | |
| 8,992,102 B1 | 3/2015 | Samuels et al. | |
| 9,030,606 B2 | 5/2015 | Campbell | |
| D732,593 S | 6/2015 | Woodman | |
| D734,799 S | 7/2015 | Woodman et al. | |
| D735,790 S | 8/2015 | Gioscia et al. | |
| D740,876 S | 10/2015 | Woodman et al. | |
| D741,394 S | 10/2015 | Gioscia et al. | |
| 9,154,676 B1 | 10/2015 | Musec et al. | |
| D750,690 S | 3/2016 | Lee et al. | |
| D751,133 S | 3/2016 | Gioscia et al. | |
| D752,672 S | 3/2016 | Clearman et al. | |
| D759,145 S | 6/2016 | Lee et al. | |
| 9,360,742 B1 | 6/2016 | Harrison | |
| 2001/0043281 A1 | 11/2001 | Onuki et al. | |
| 2002/0101534 A1 | 8/2002 | Liu | |
| 2003/0179306 A1 | 9/2003 | Lee | |
| 2004/0076415 A1 | 4/2004 | Da Silva | |
| 2005/0036031 A1 | 2/2005 | Weber | |
| 2006/0015664 A1 | 1/2006 | Zhang | |
| 2006/0017836 A1 | 1/2006 | Nuno et al. | |
| 2006/0055820 A1 | 3/2006 | Lyon et al. | |
| 2006/0066753 A1 | 3/2006 | Gennetten et al. | |
| 2006/0098966 A1 | 5/2006 | Takahashi et al. | |
| 2006/0146176 A1 | 7/2006 | Kato et al. | |
| 2007/0071423 A1 | 3/2007 | Fantone et al. | |
| 2007/0268382 A1 | 11/2007 | Shiomi | |
| 2008/0089678 A1 | 4/2008 | Suzuki | |
| 2008/0156509 A1 | 7/2008 | Ikeo | |
| 2008/0253756 A1 | 10/2008 | Gourova | |
| 2009/0046156 A1 | 2/2009 | Iwasaki | |
| 2010/0060747 A1 * | 3/2010 | Woodman | G03B 17/02 348/222.1 |
| 2014/0104479 A1 | 4/2014 | Samuels et al. | |
| 2014/0267894 A1 | 9/2014 | Campbell | |
| 2015/0022717 A1 | 1/2015 | Coons et al. | |
| 2015/0049243 A1 | 2/2015 | Samuels et al. | |
| 2015/0103236 A1 | 4/2015 | Woodman et al. | |
| 2015/0192841 A1 | 7/2015 | Bennett et al. | |
| 2016/0004142 A1 | 1/2016 | Zhang | |
| 2016/0100083 A1 | 4/2016 | Harrison | |
| 2016/0119516 A1 | 4/2016 | Clearman | |
| 2017/0060184 A1 * | 3/2017 | Ranetkins | G03B 17/08 |

OTHER PUBLICATIONS

International Search Report and Written Opinion, PCT/US2009/049821, dated Mar. 9, 2009.

\* cited by examiner

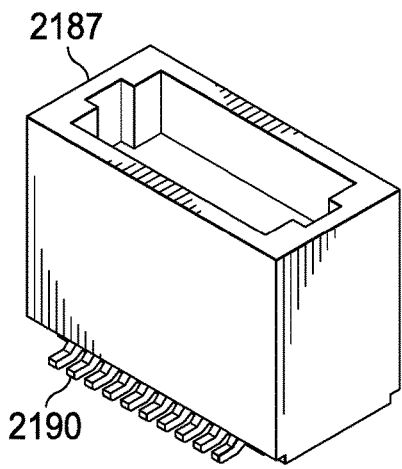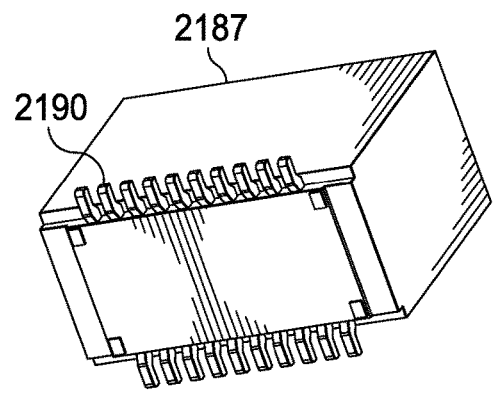
FIG. 21I  FIG. 21J
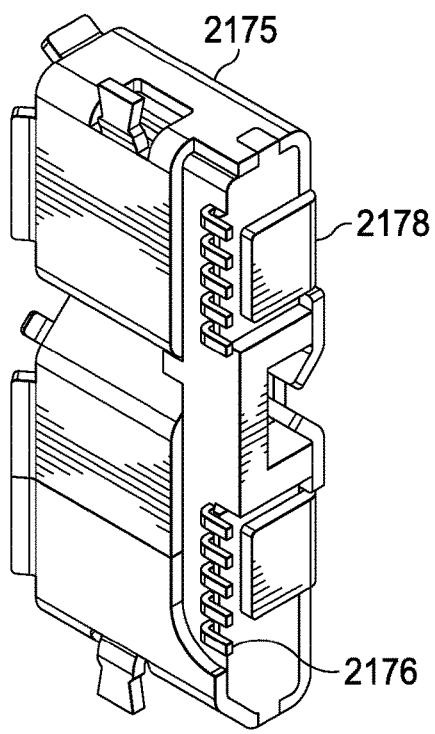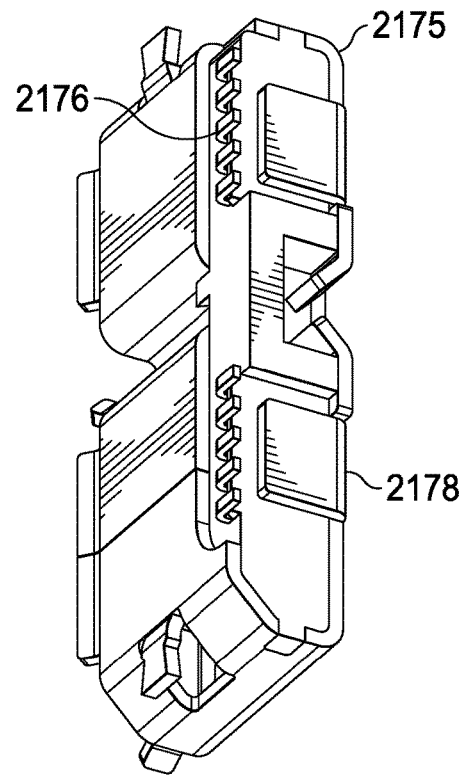
FIG. 21K  FIG. 21L

CAMERA CASE WITH REMOVABLE CARRIER, FILTER RECEIVER, EXTERNAL BATTERY AND SUPPLEMENTAL MEMORY STORAGE

CROSS REFERENCE TO RELATED APPLICATIONS

This application claims the benefit of U.S. Provisional Patent Application Ser. No. 62/217,496 filed Sep. 11, 2015.

STATEMENT REGARDING FEDERALLY SPONSORED RESEARCH OR DEVELOPMENT

Not applicable.

TECHNICAL FIELD

An environmentally sealed housing for a portable camera/video recorder with an integrated inner housing for supporting an integrated external battery supplement and additional memory storage.

BACKGROUND OF THE INVENTION

The typical camera housing is not waterproof, and it cannot withstand water pressures of any significant amount, which means electronics and camera equipment is subjected to water failures. Some prior art housings include waterproof cases for smart phones, but images quality of the camera unit is sacrificed and there is no zoom capability that is operable through these cases. Several such waterproof shields are shown in FIGS. 1A and 1B. These cases also do not contain additional battery and memory storage integrated therein.

There are also "bubble shields" that envelope a smart phone device in a flexible envelope, but picture quality is sacrificed with these flexible envelopes. Such "bubble shield" diagrams are shown at FIGS. 1C and 1D. These cases also do not contain additional battery and memory storage integrated therein.

There are also waterproof digital cameras available on the market, such that no protective case is needed. These waterproof cameras allow for zoom lens and flash use, with certain built-in features. These waterproof cameras cannot withstand water pressures of any significant amount, which means electronics and camera equipment is subjected to water failures. These devices also do not contain additional battery and memory storage integrated therein. Waterproof cameras of this type are shown at FIGS. 1E, 1F and 1G.

SUMMARY OF THE INVENTION

The present invention is a supplemental waterproof housing that completely surrounds the unit and housing of a camera device, which may be a single shot film, digital video device, photographic camera, or digital video recorder. In addition to the outer waterproof housing, the present invention encloses an integrated and removable supplemental external battery and supplemental memory storage inside the external housing, and a mounting point for lenses, filters or adaptors and handles attached to outside to the external housing.

The internal compartment of the housing encloses an inner housing that holds the camera, and allows easy connections to the removable memory chips and removable battery packs through coupling adapters, connectors and bridges, which is all integrated into and enclosed by the external housing. The present invention also allows access to the internal compartment with one side of the inner housing providing a seal on one side of the waterproof housing, which is secured through waterproof seals, couplings and latches on the outside of the housing. Waterproof seals are also located on the housing and actuation pins that operate corresponding dials and buttons on the camera device, which means the housing does not need to be opened to operate the camera or video device.

The invention supports a lens of the camera that has a lens, filter or adaptor to it which allows an integrated mounting for these accessories. The invention also includes a camera housing that takes the place of the lens cap. There is no need to protect the lens if it is enclosed in the case, which means the present invention includes a housing that protects the optical glass window in the case. The present invention also incorporates an attachment couplings for a lens filter, lens hood, lens cap or adaptor into the part of the environmentally sealed housing that holds the optical glass window in place. The present invention also includes a housing for a supplemental battery pack and supplemental memory storage.

IN THE FIGURES

Figure 16A:
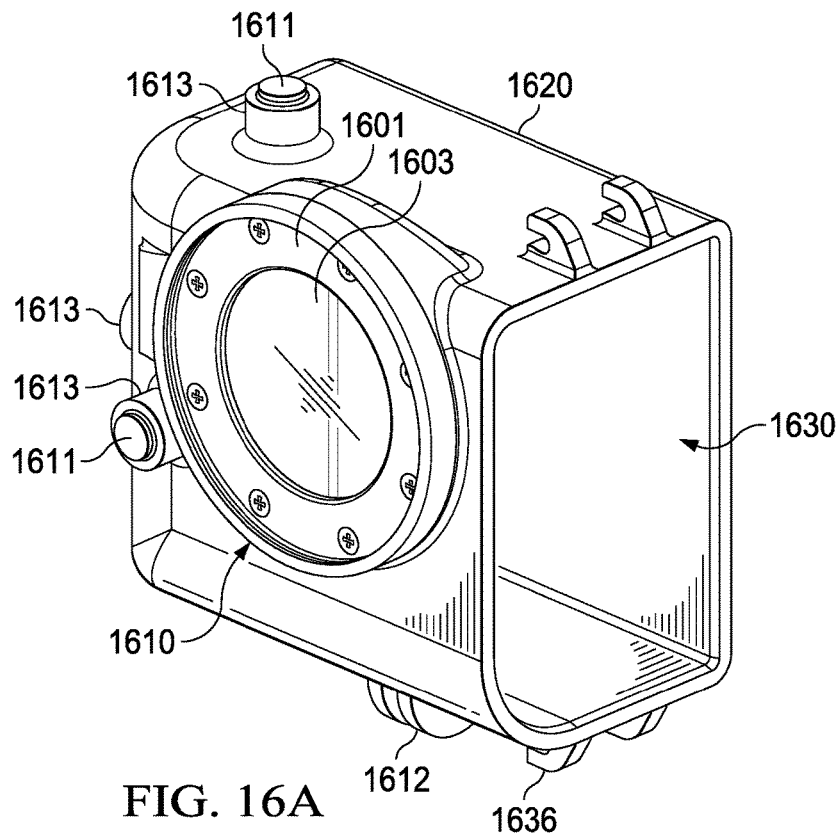
FIGS. 16A-16D are isometric views of the outer case housing used in the present invention.
Figure 16B:
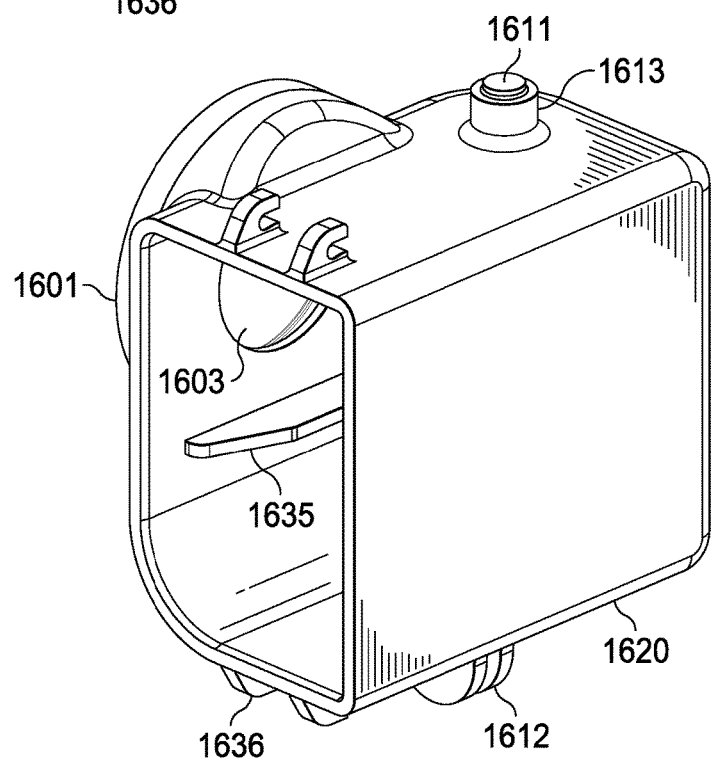
Figure 16C:
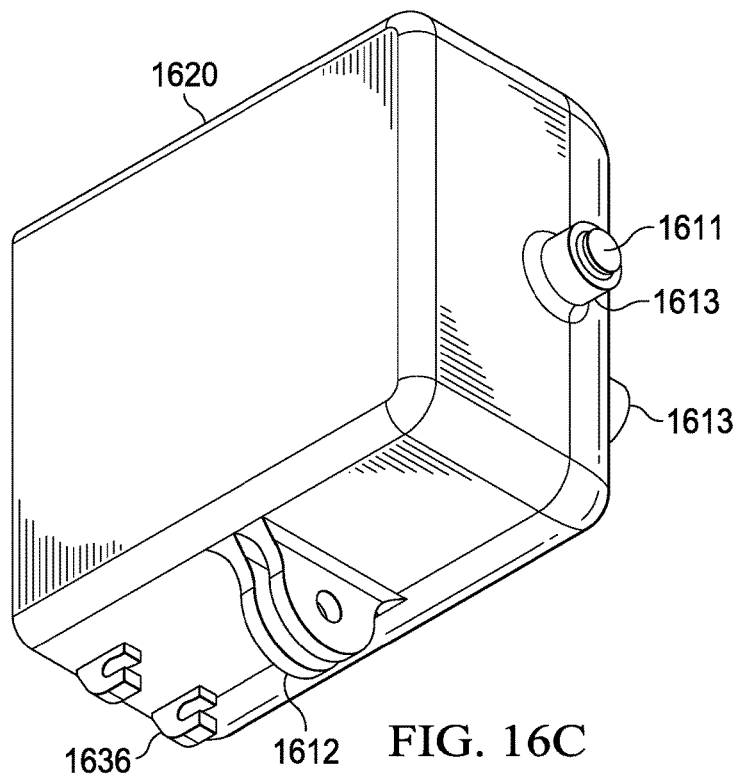
Figure 16D:
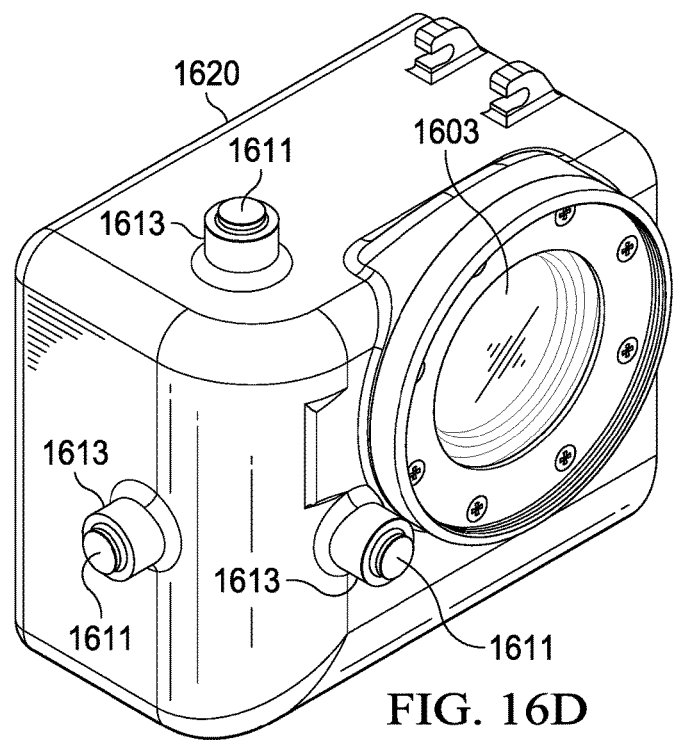
Figure 16E:
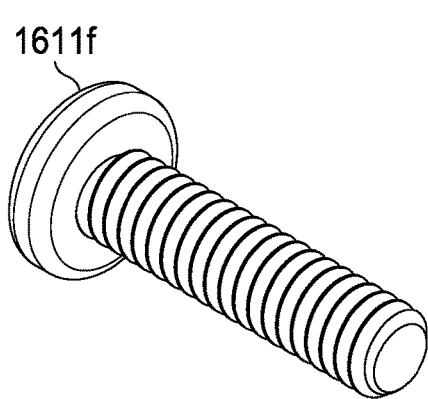
FIG. 16E is an isometric view of the pan head Phillip screw.
Figure 16F:
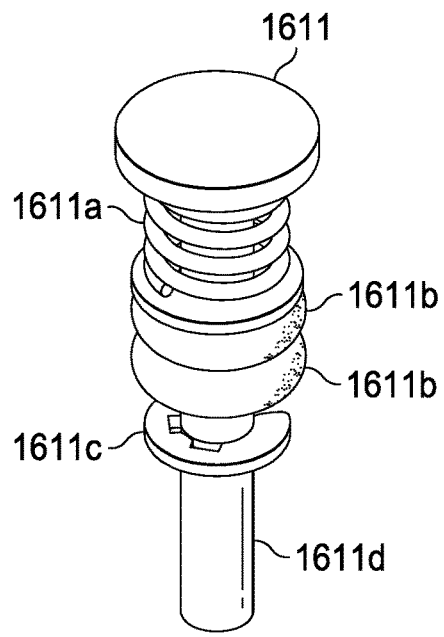
Figure 16G:
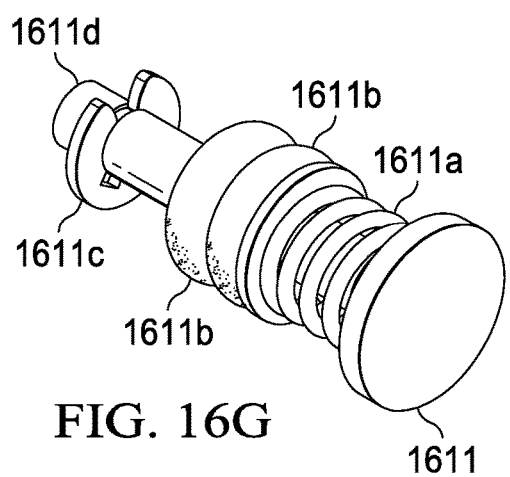
Figure 16H:
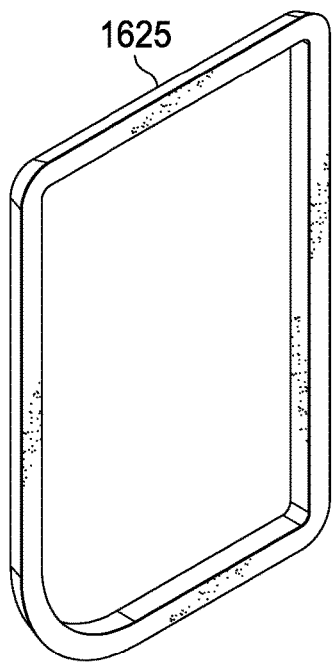
Figure 17A:
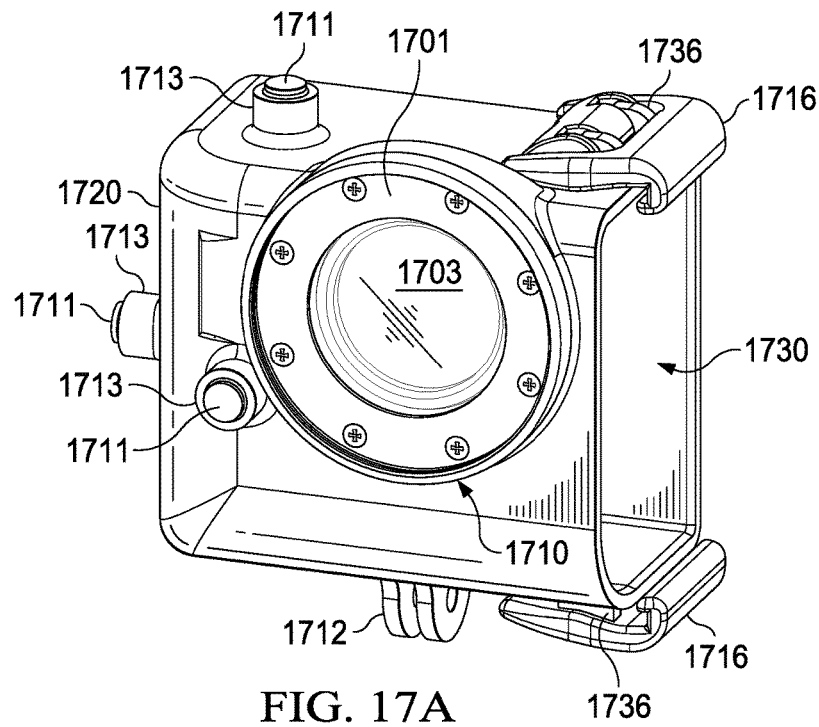
Figure 17B:
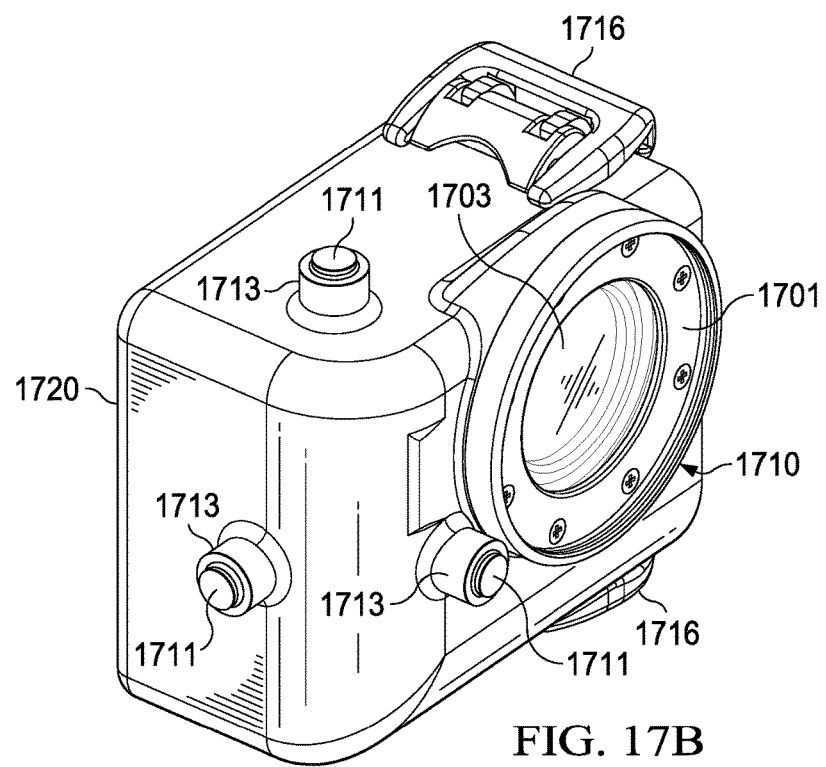
Figure 17C:
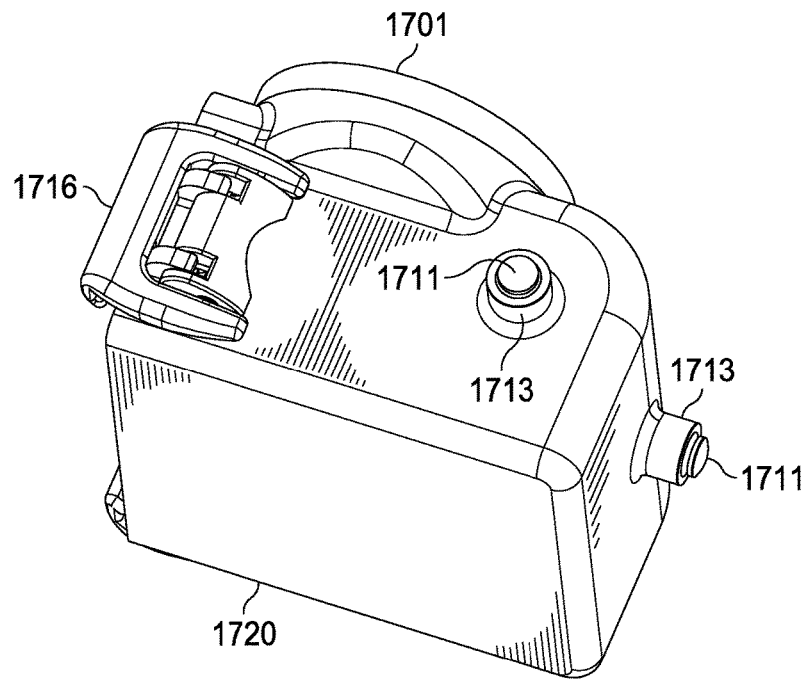
Figure 17D:
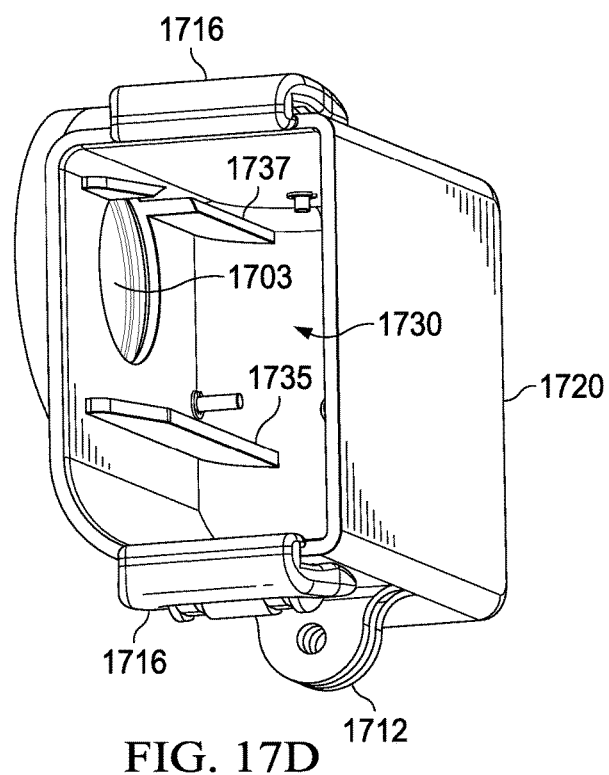
Figure 17E:
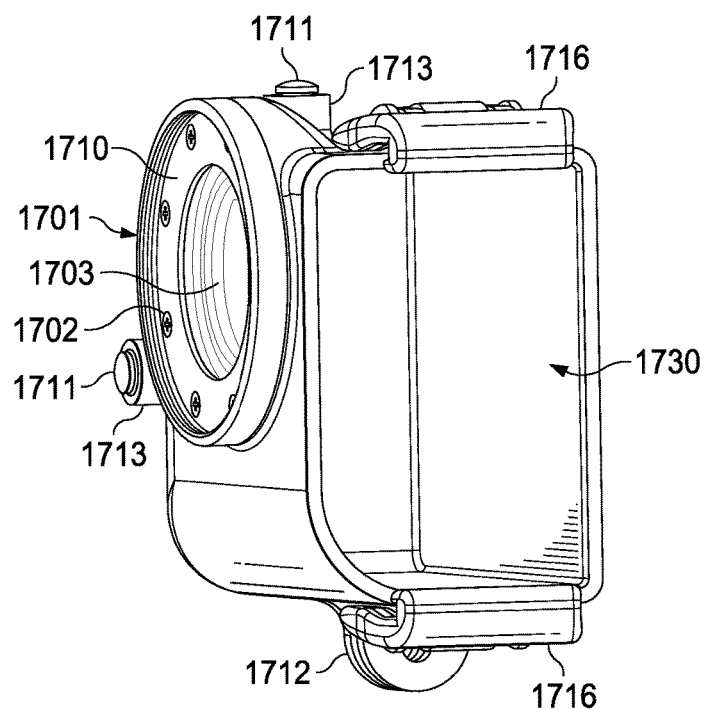
Figure 17F:
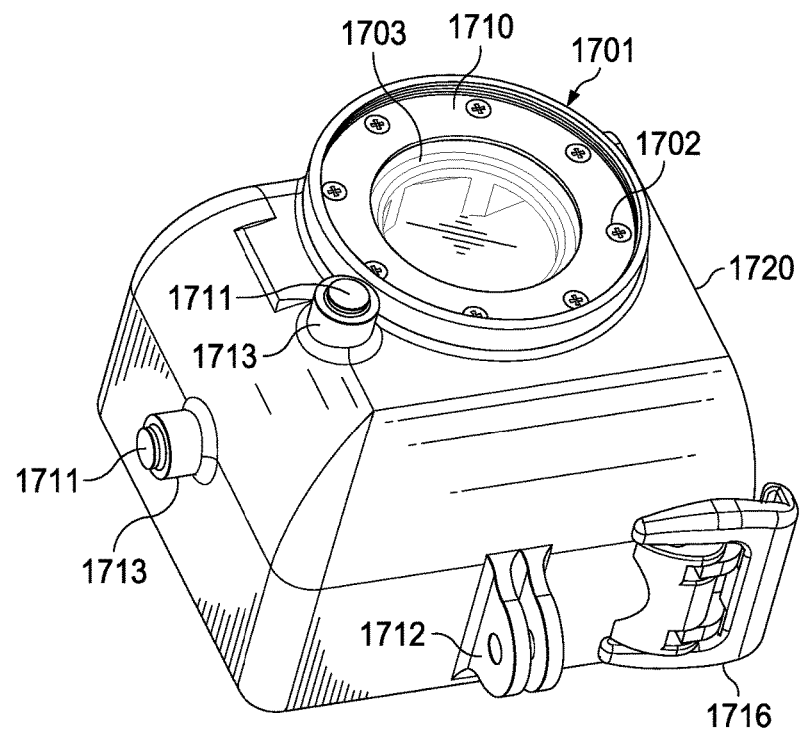
Figure 17G:
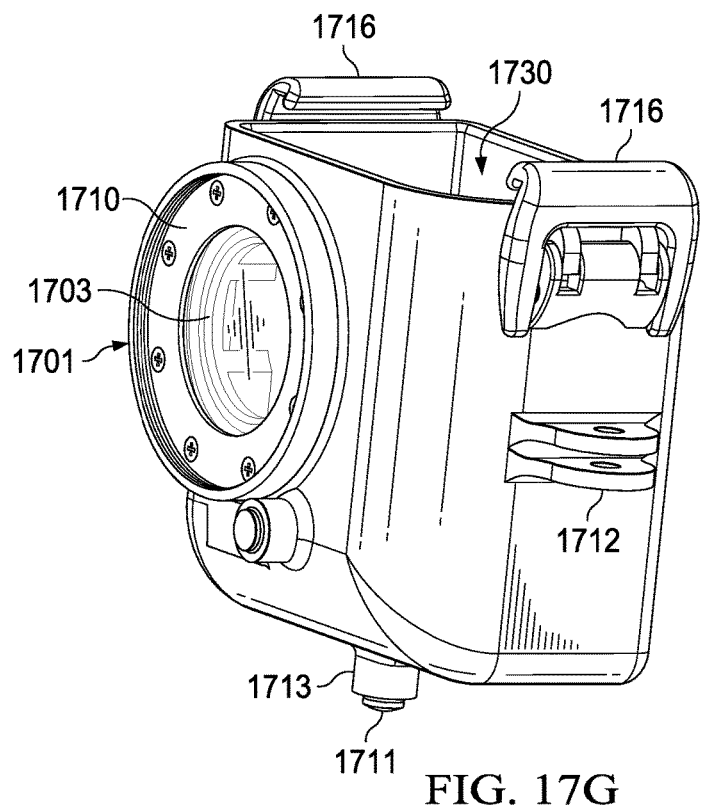
Figure 18A:
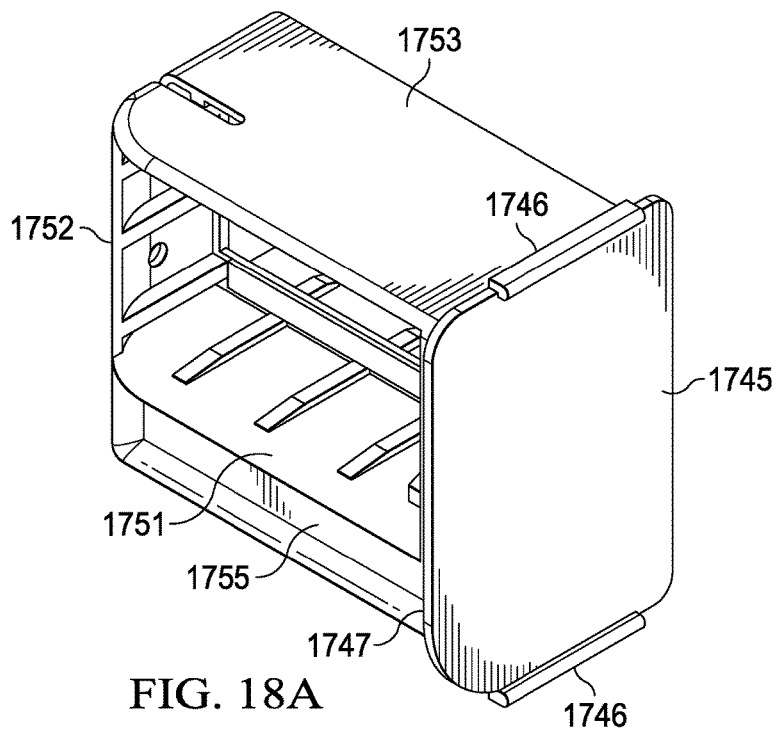
Figure 18B:
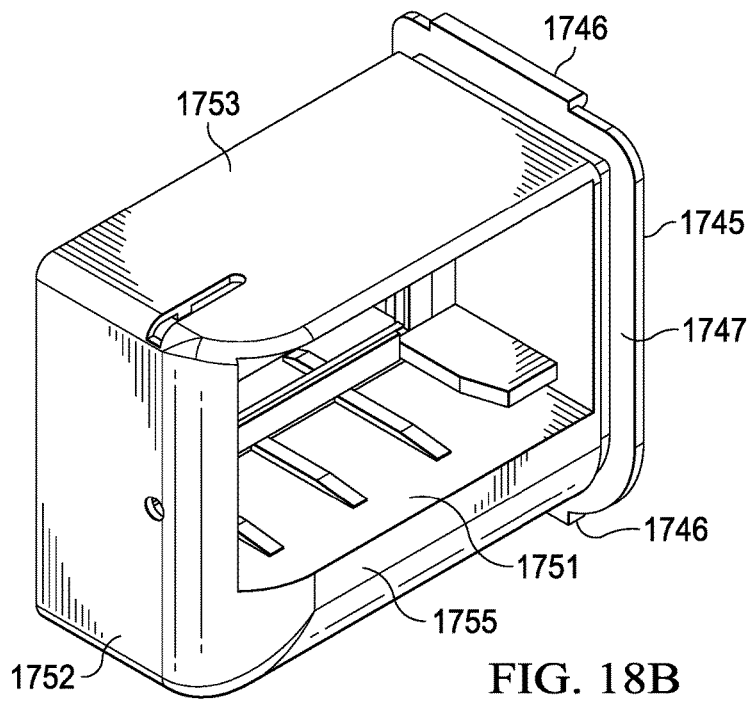
Figure 18C:
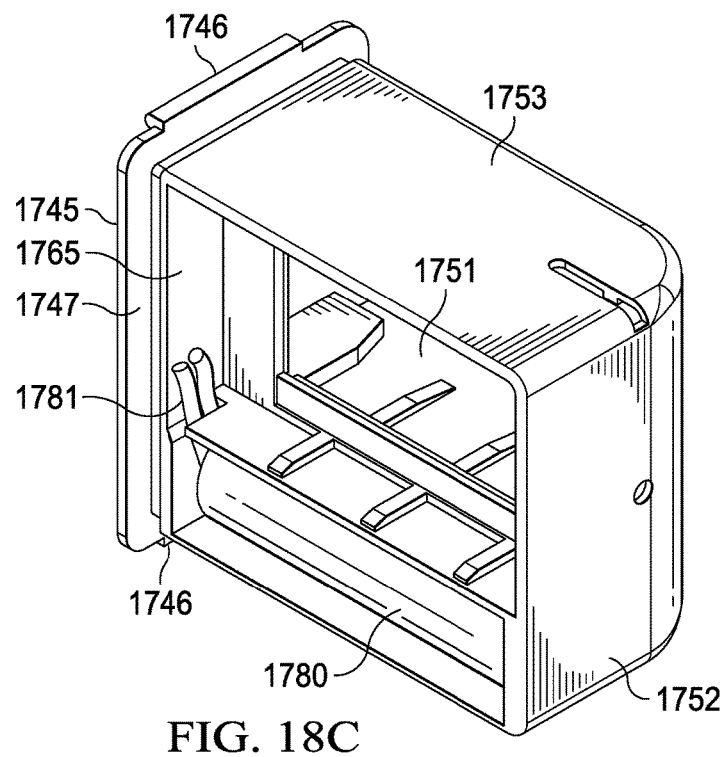
Figure 18D:
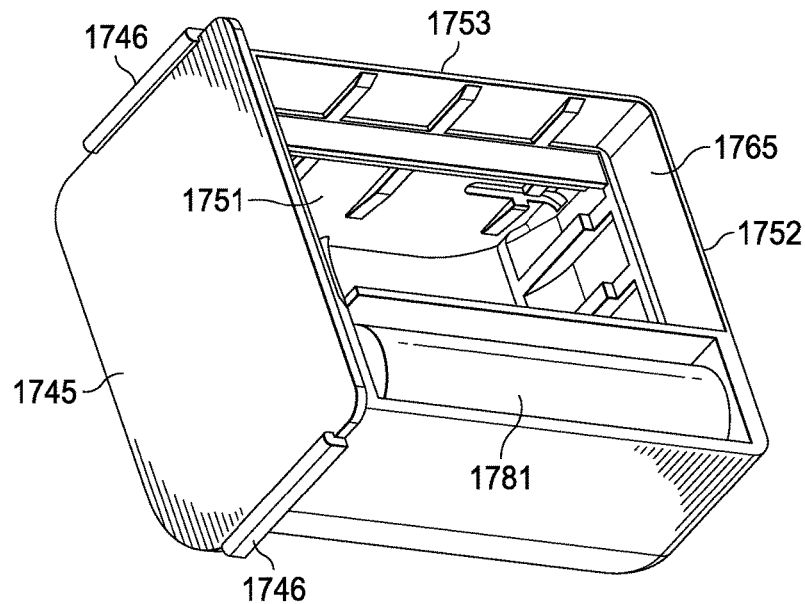
Figure 18E:
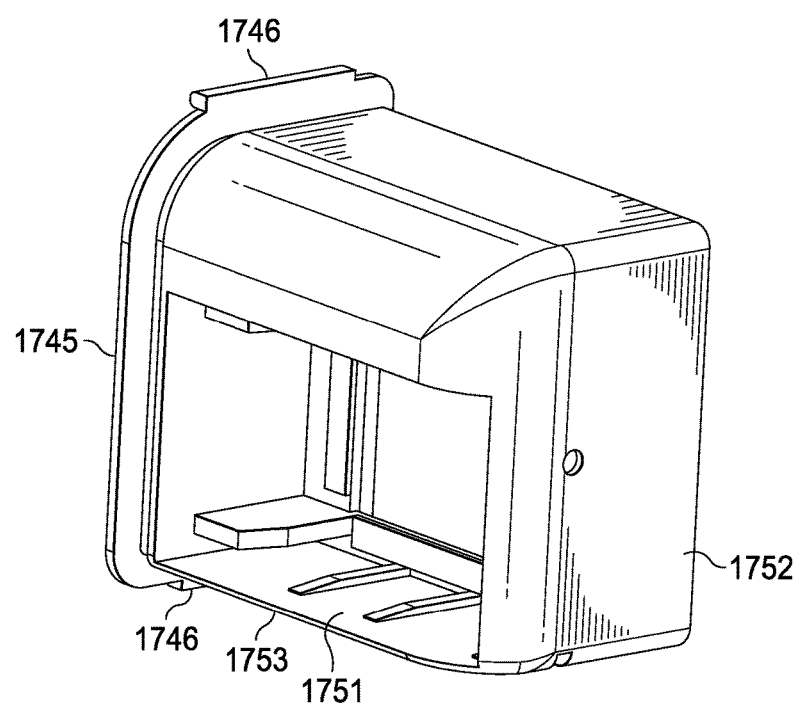
Figure 18F:
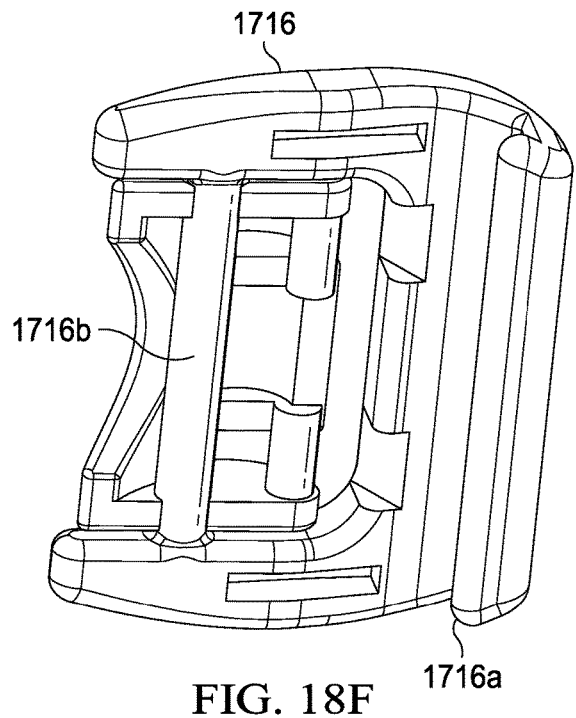
Figure 18G:
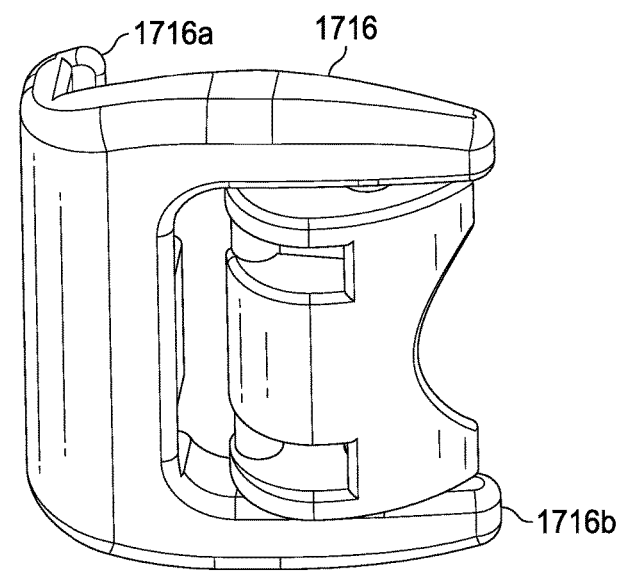
Figure 18H:
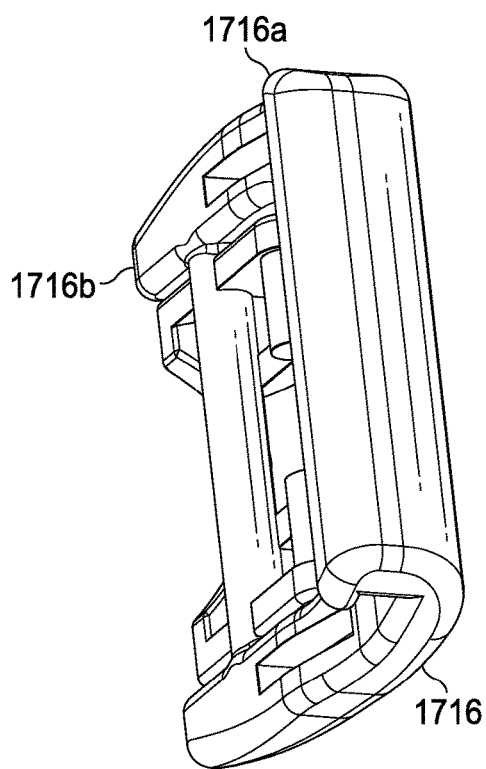
Figure 18I:
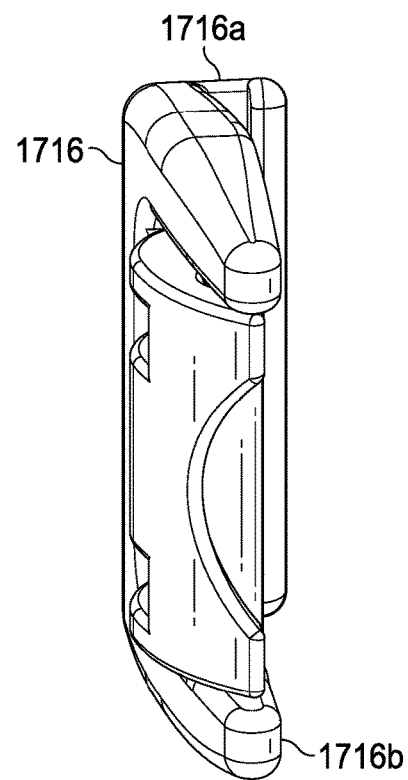
Figure 18J:
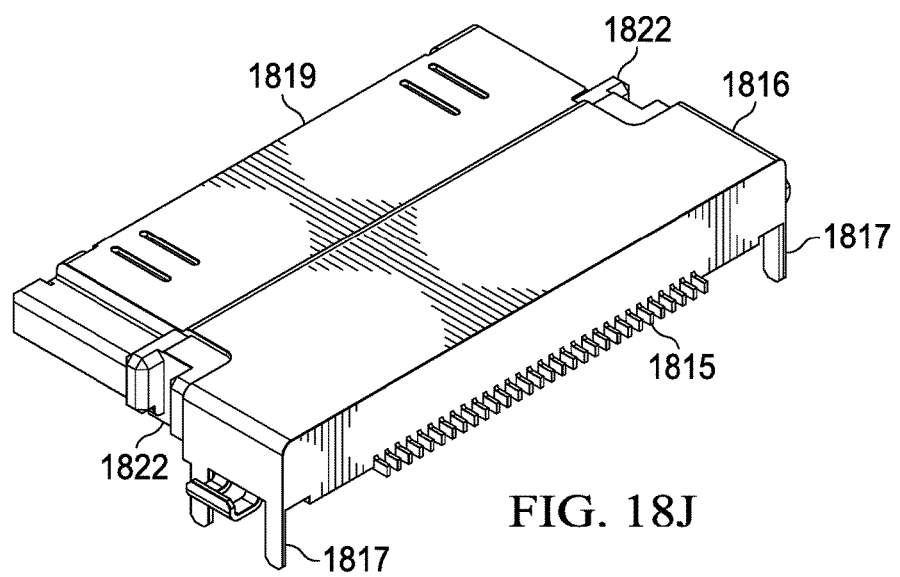
Figure 18K:
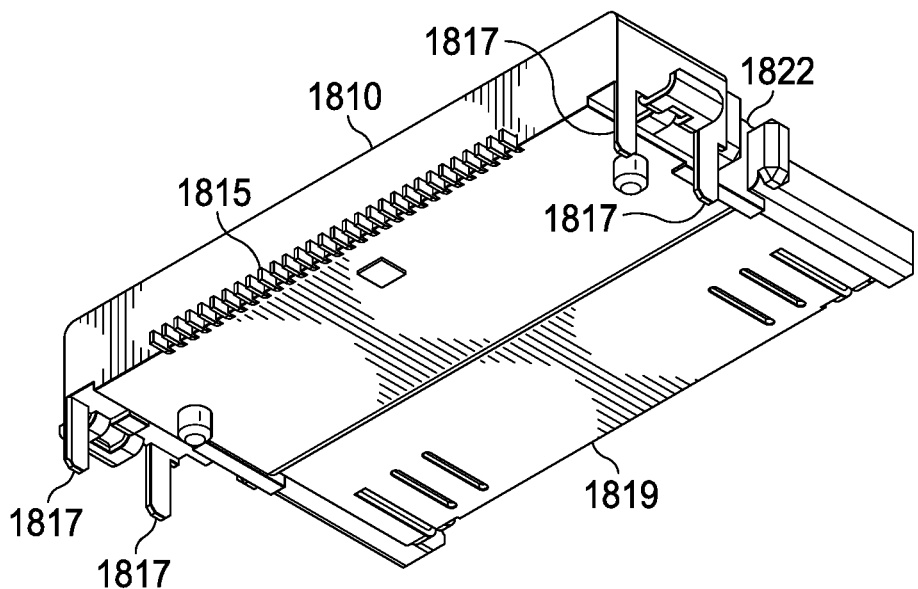
Figure 18L:
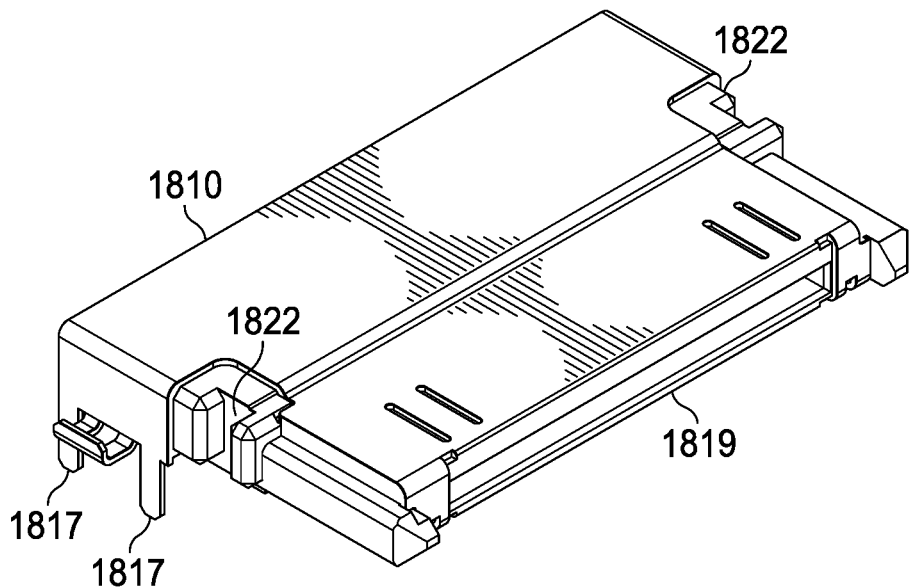
Figure 18M:
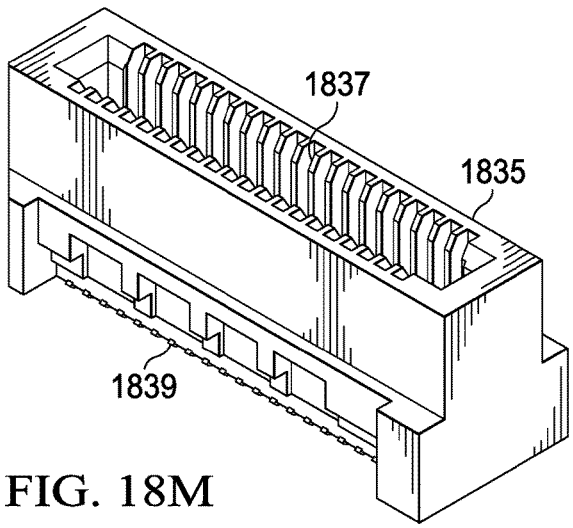
Figure 18N:
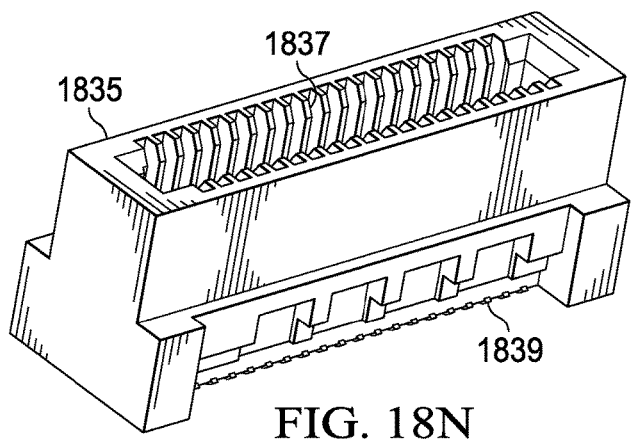
Figure 18O:
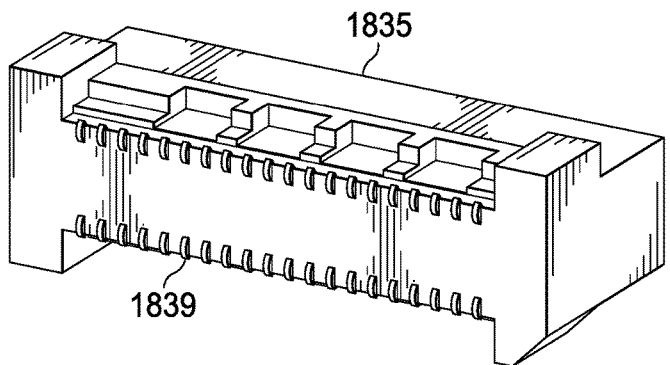
Figure 19A:
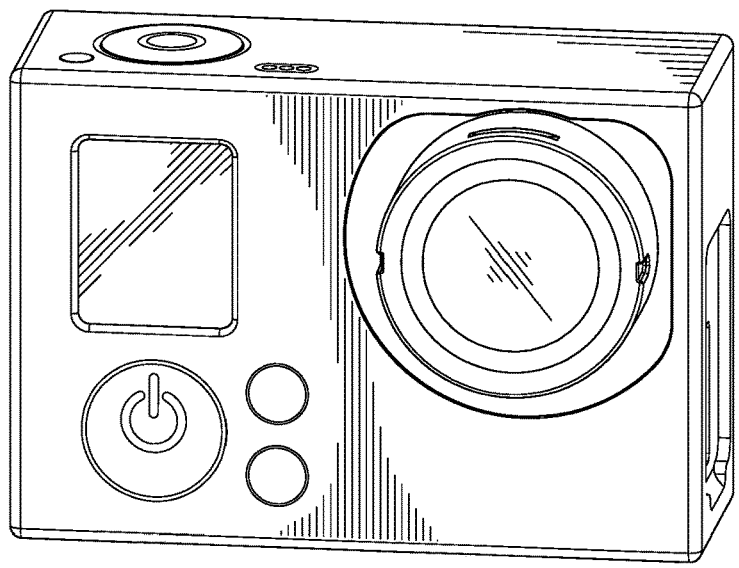
Figure 19B:
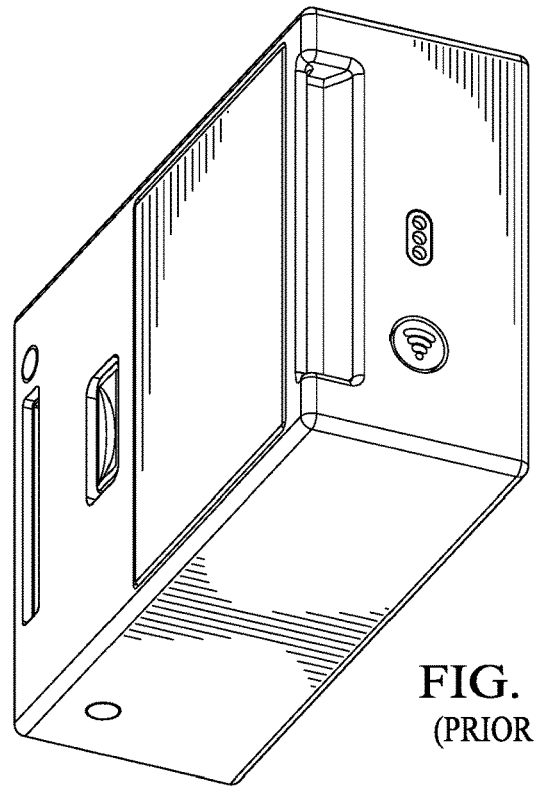
Figure 19C:
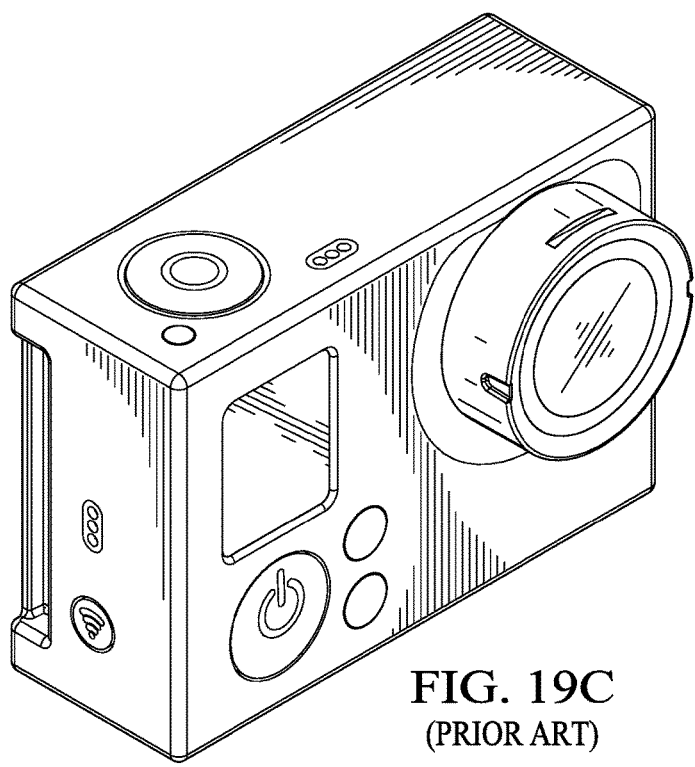
Figure 19D:
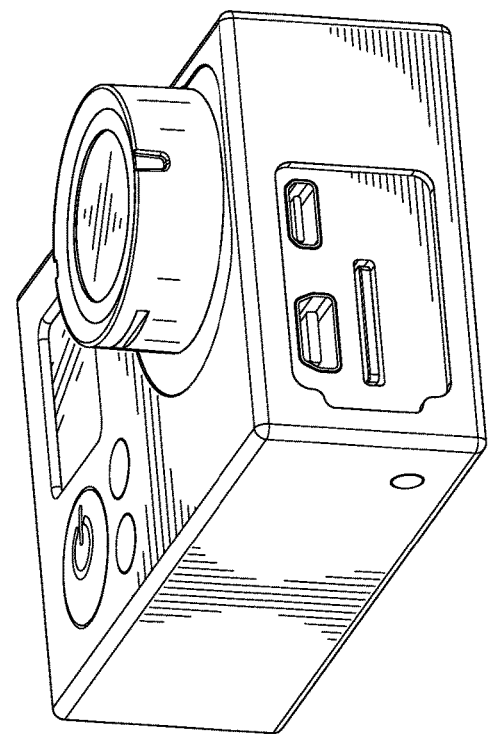
Figure 19E:
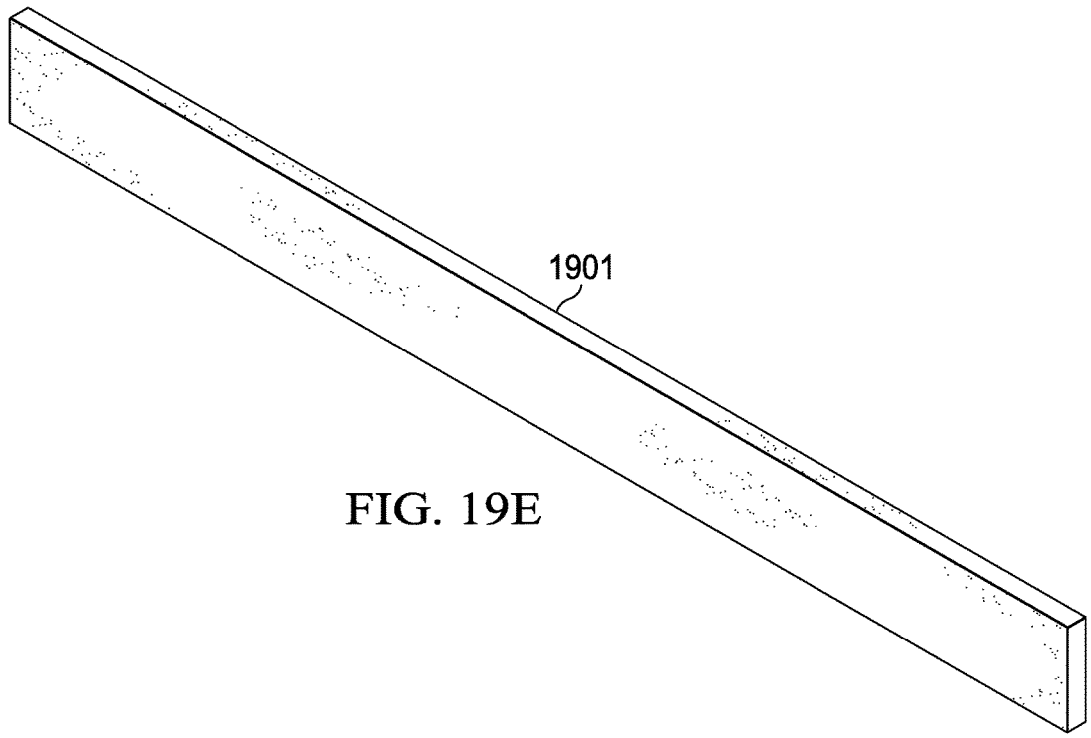
Figure 19F:
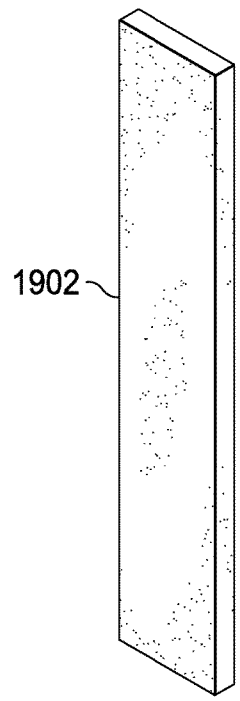
Figure 19G:
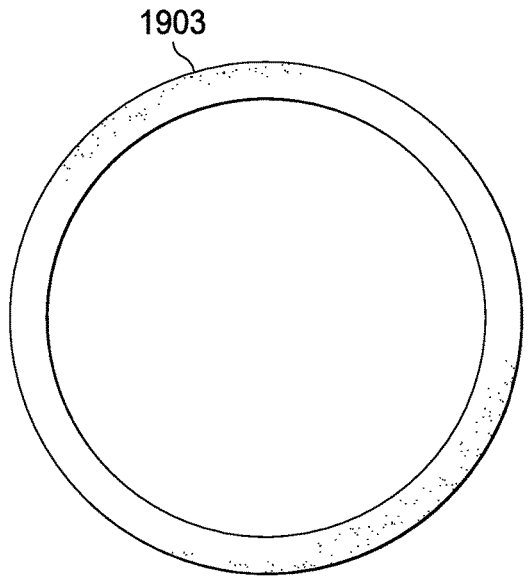
Figure 19H:
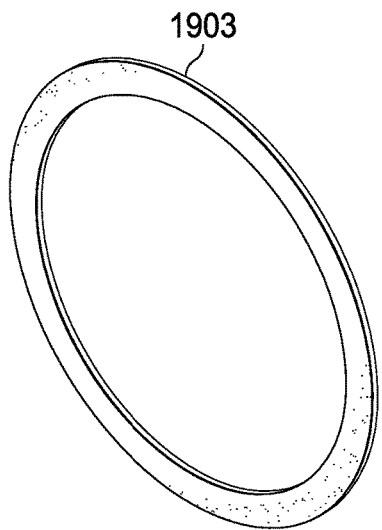
Figure 19I:
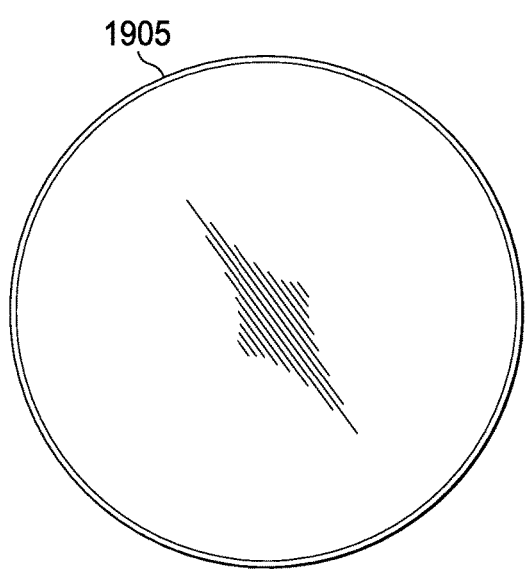
Figure 19J:
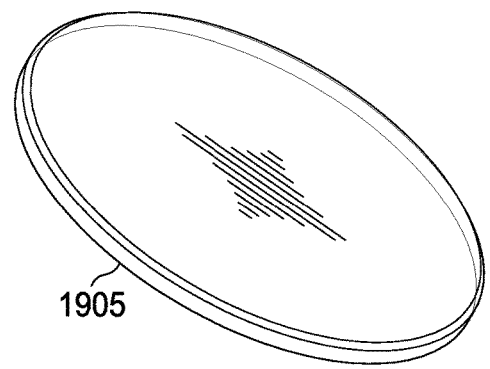
Figure 20A:
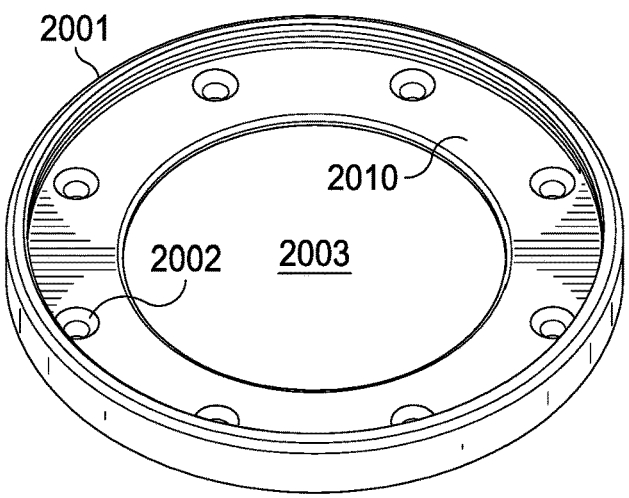
Figure 20B:
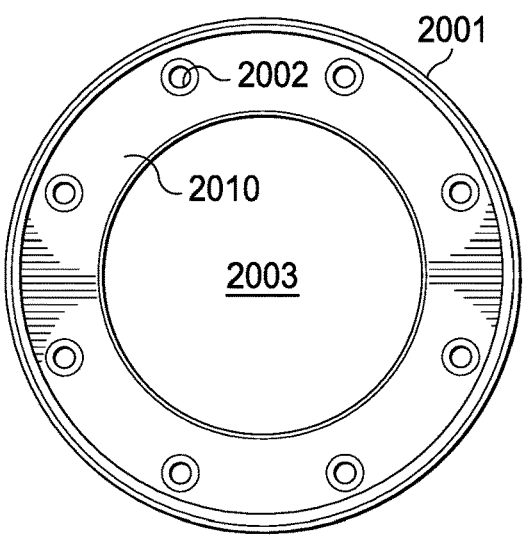
Figure 20C:
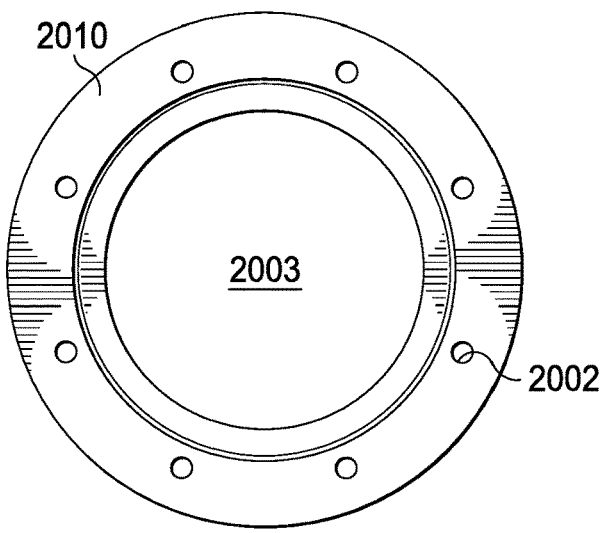
Figure 21A:
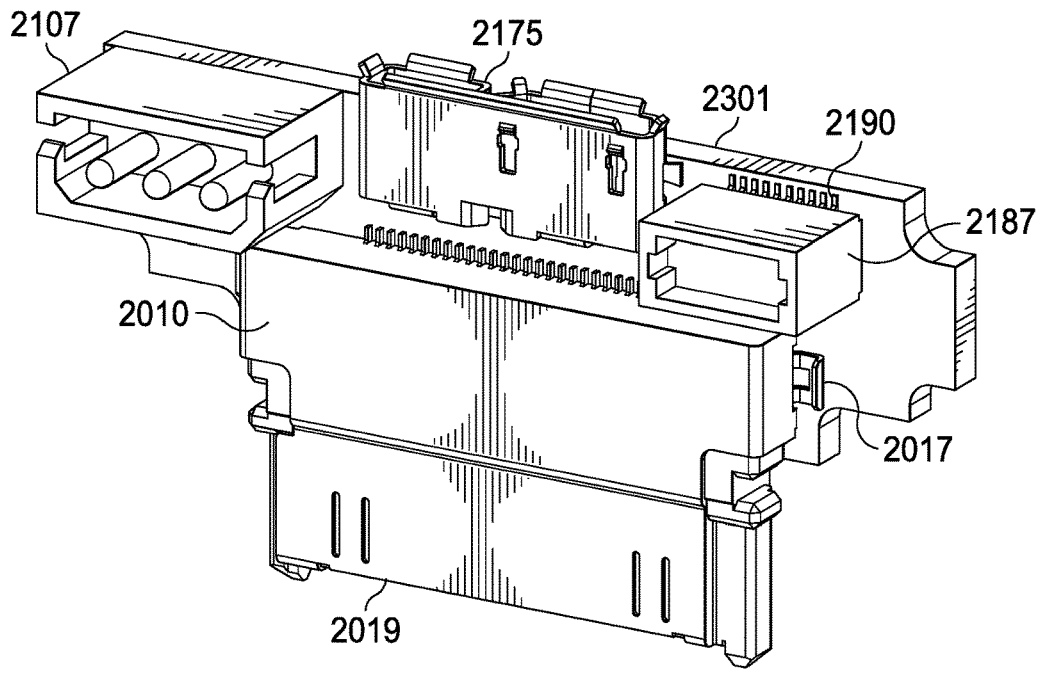
Figure 21B:
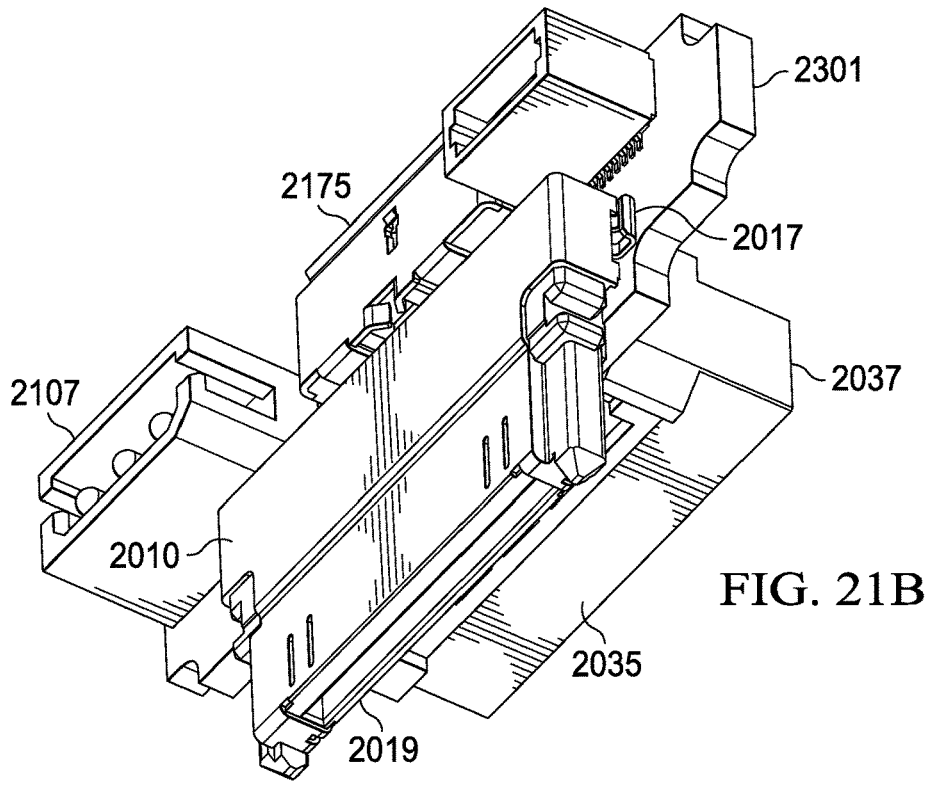
Figure 21C:
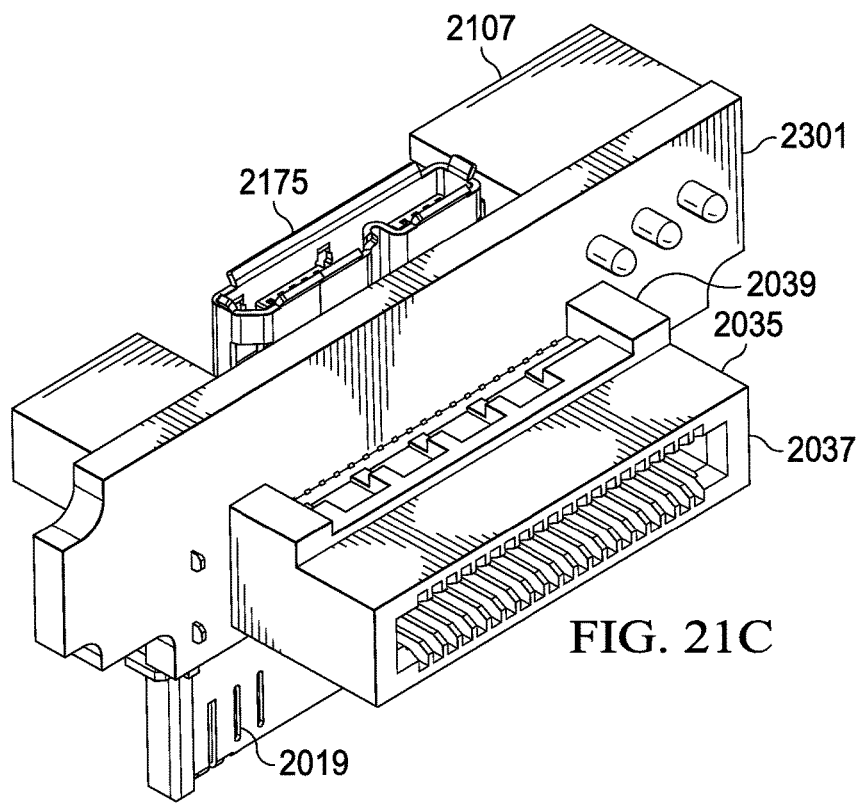
Figure 21D:
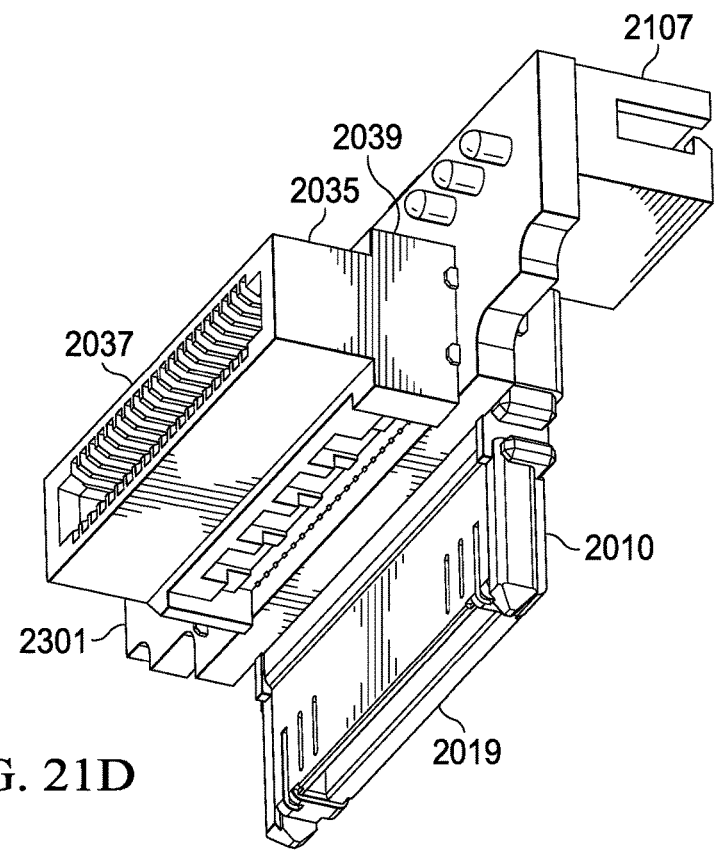
Figure 21E:
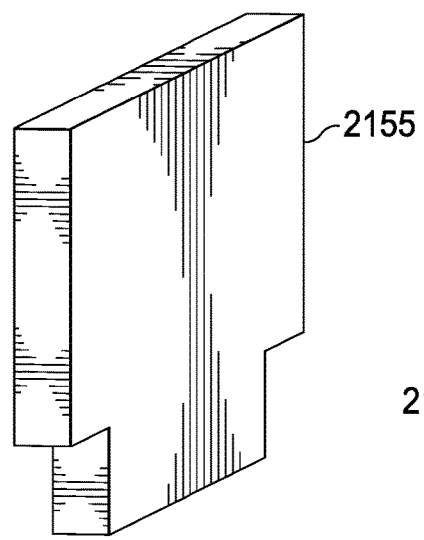
Figure 21F:
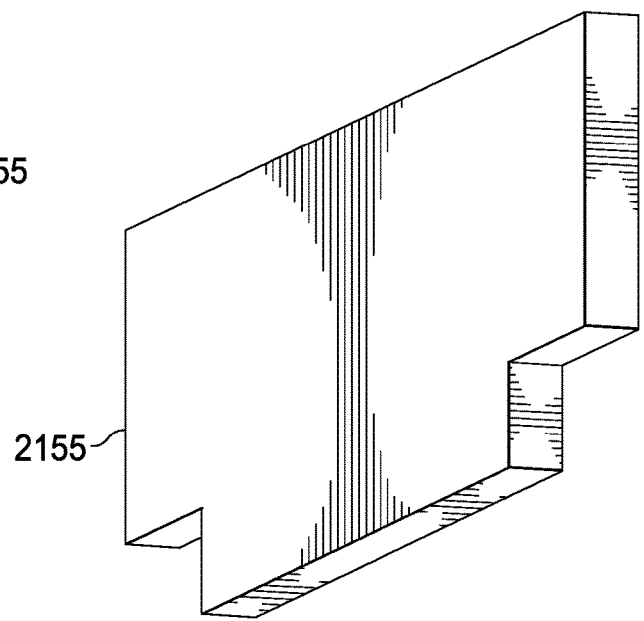
Figure 21G:
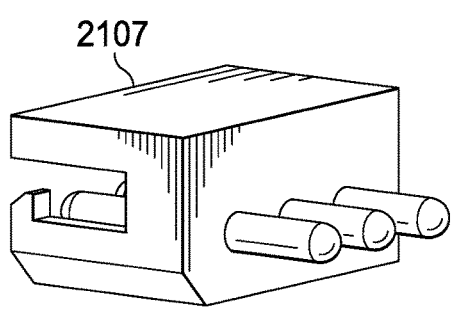
Figure 21H:
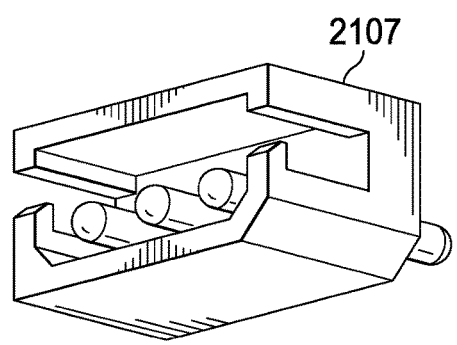
Figure 21M:
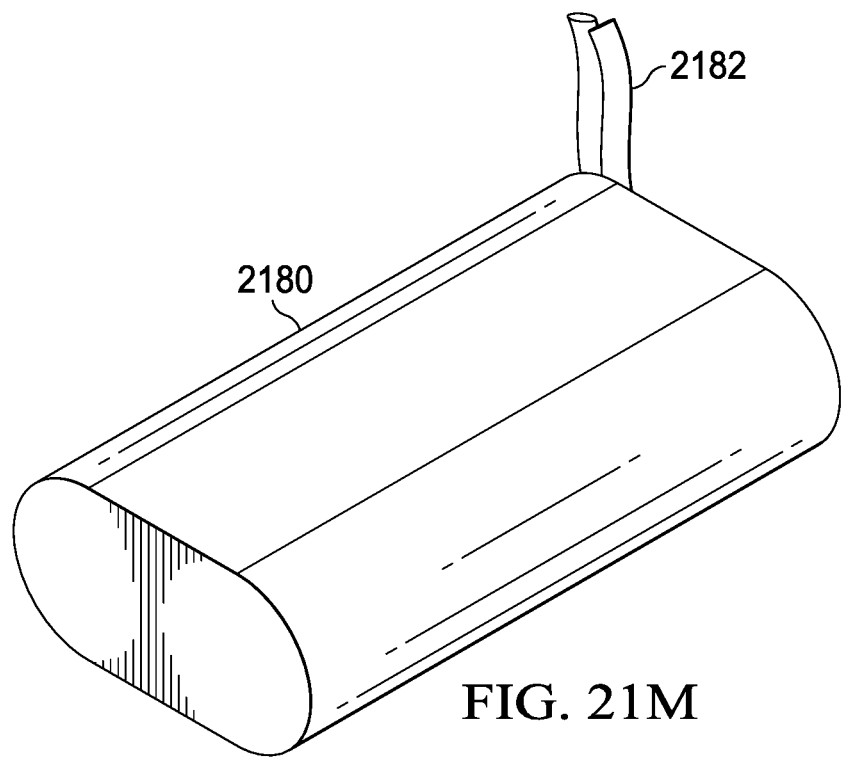
Figure 21N:
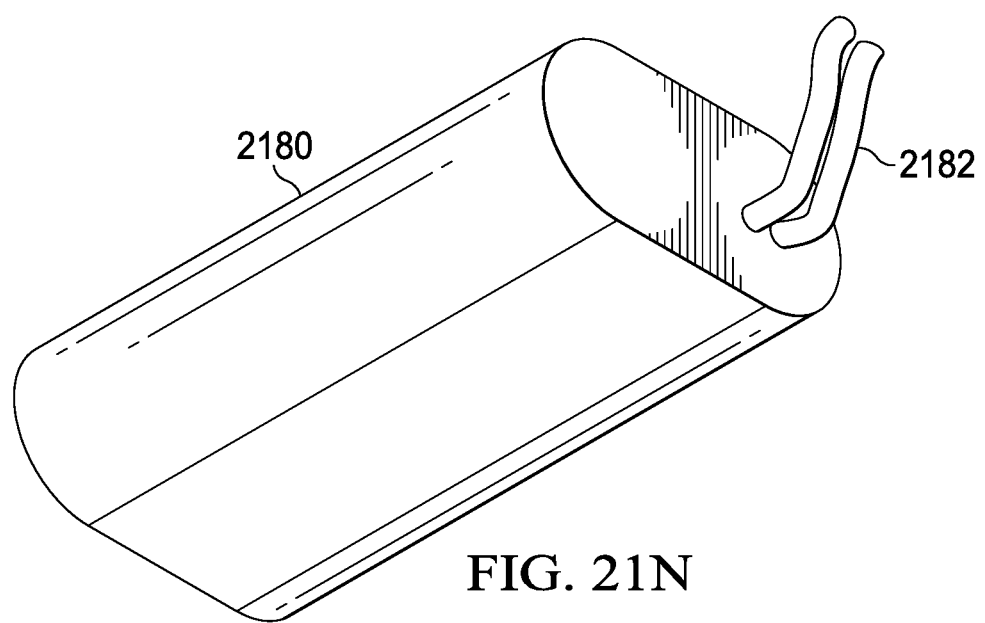
Figure 21O:
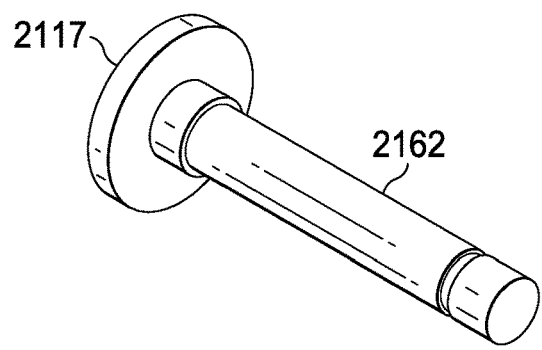
Figure 21P:
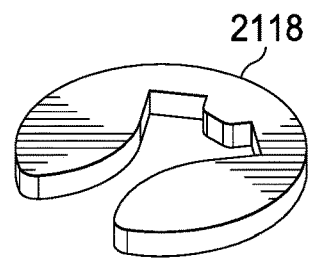
Figure 22A:
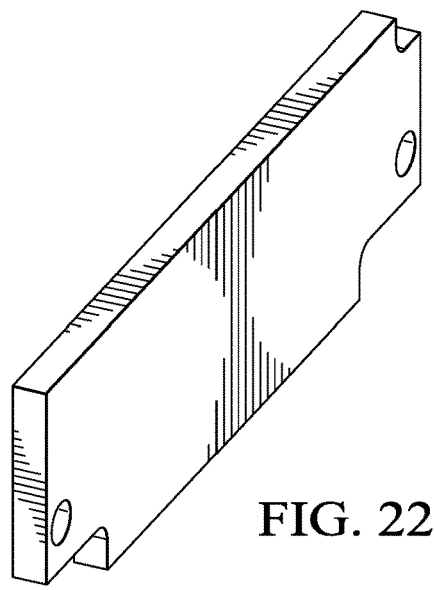
Figure 22B:
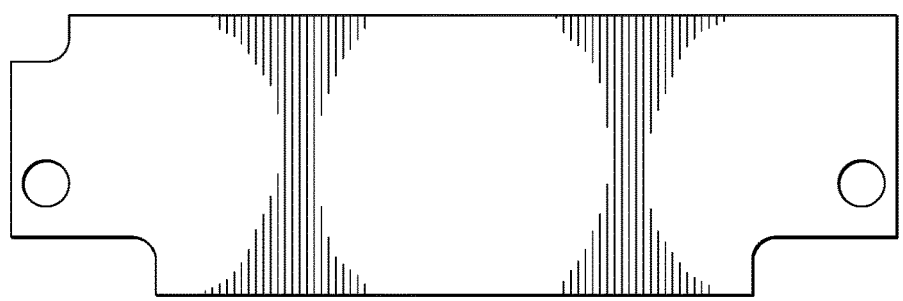
Figure 23A:
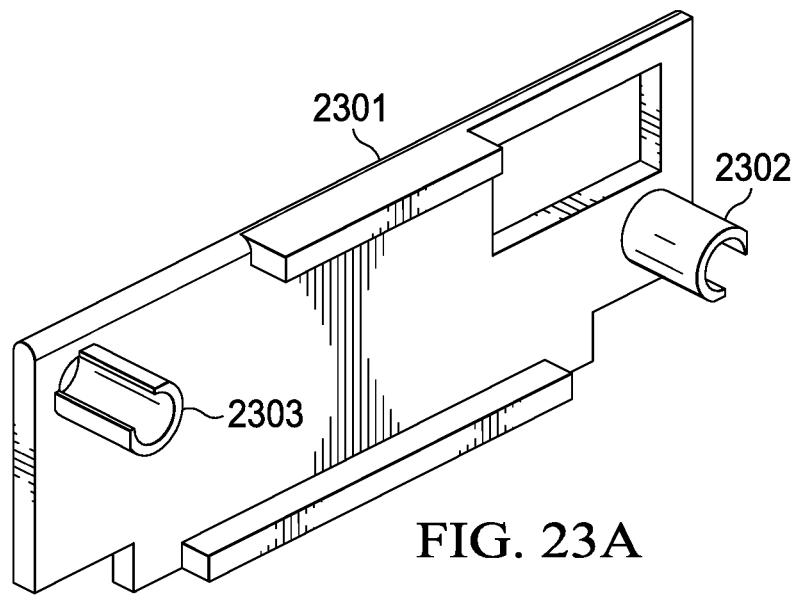
Figure 23B:
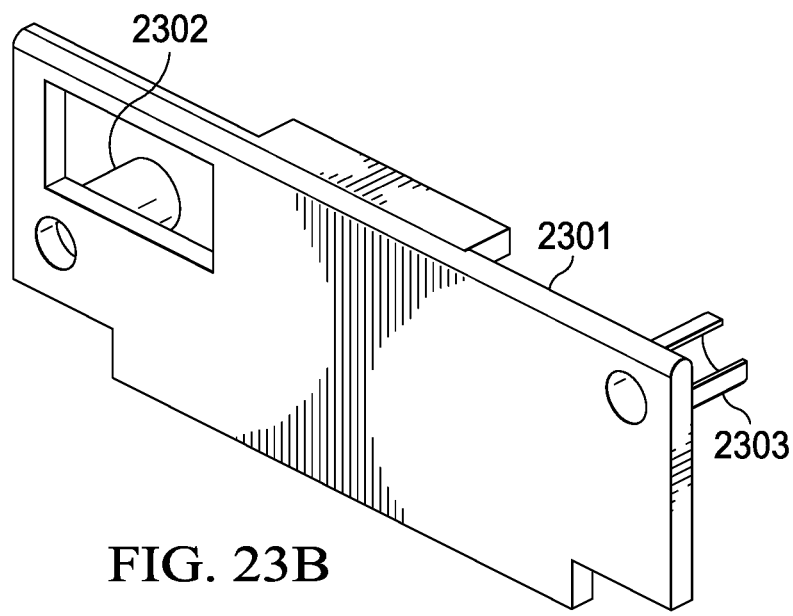
Figure 23C:
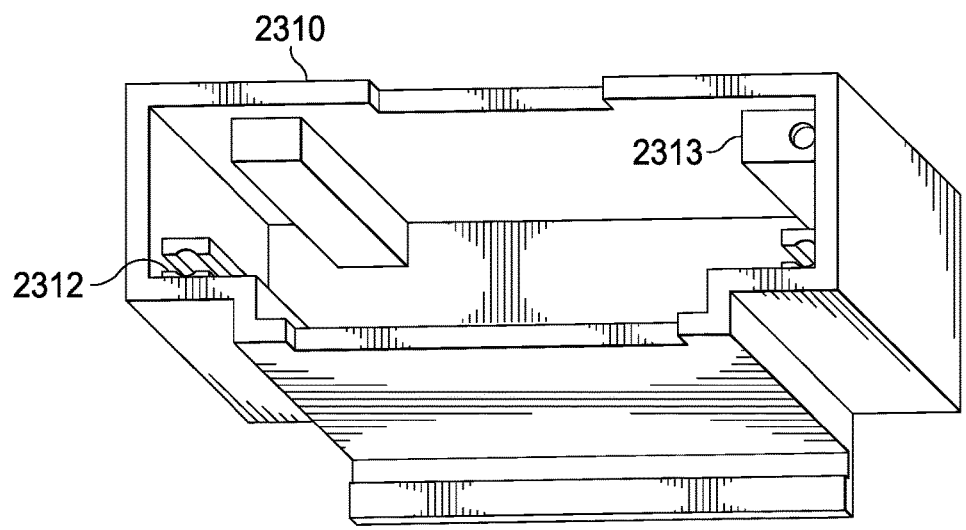
Figure 23D:
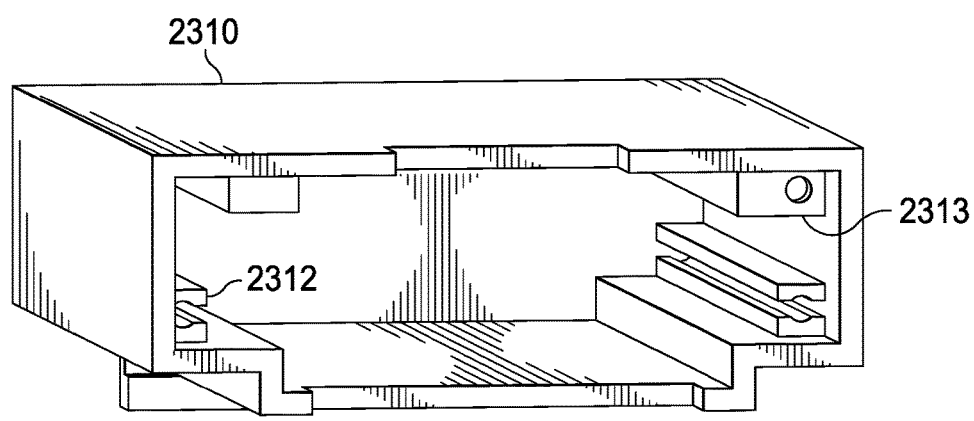
Figure 23E:
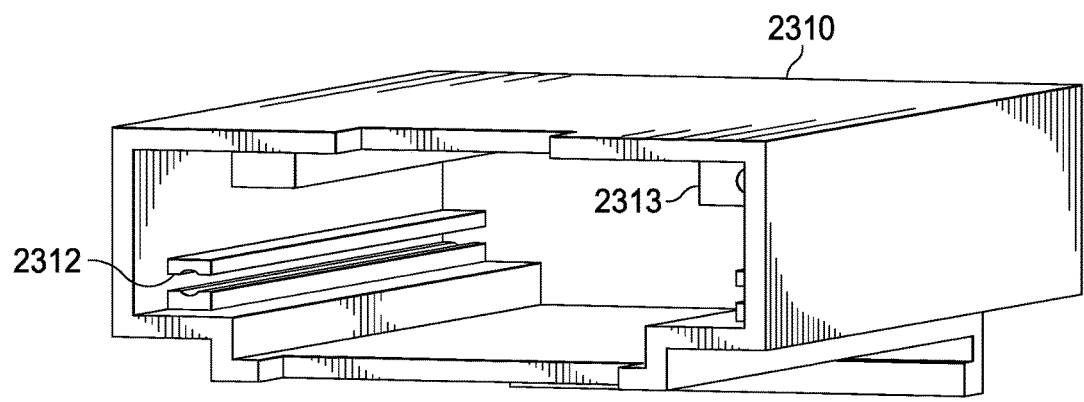
Figure 23F:
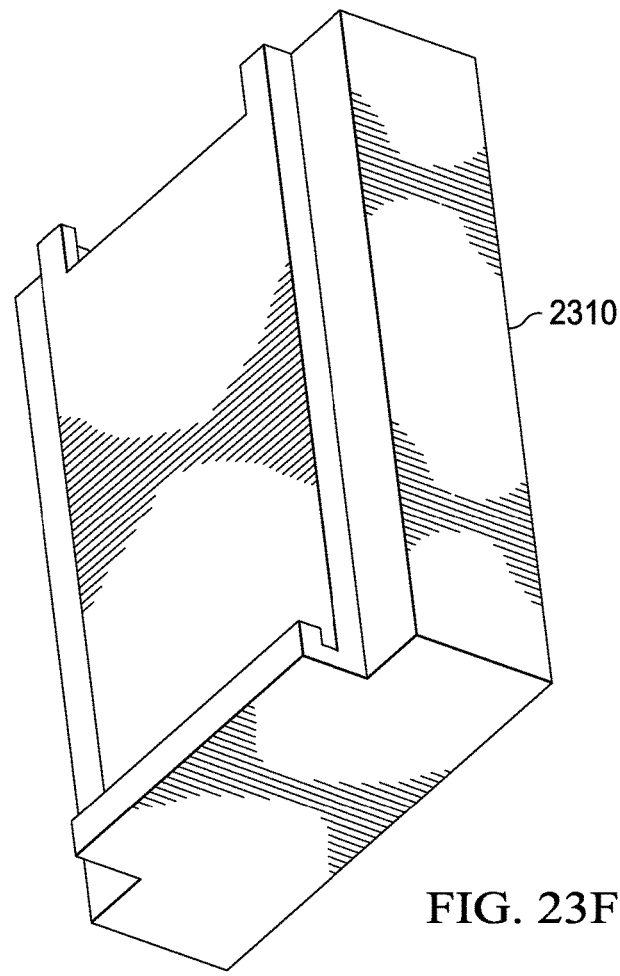
Figure 23G:
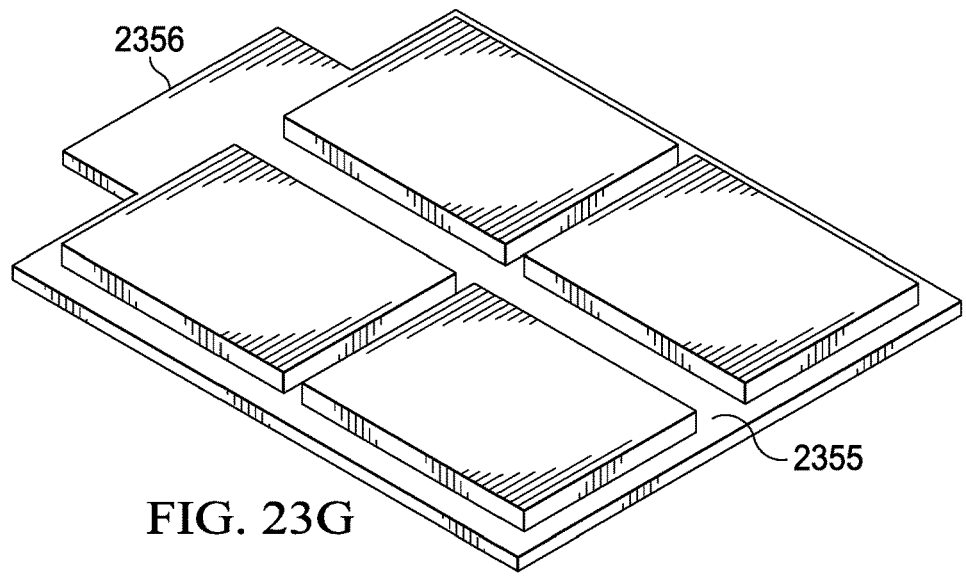
Figure 23H:
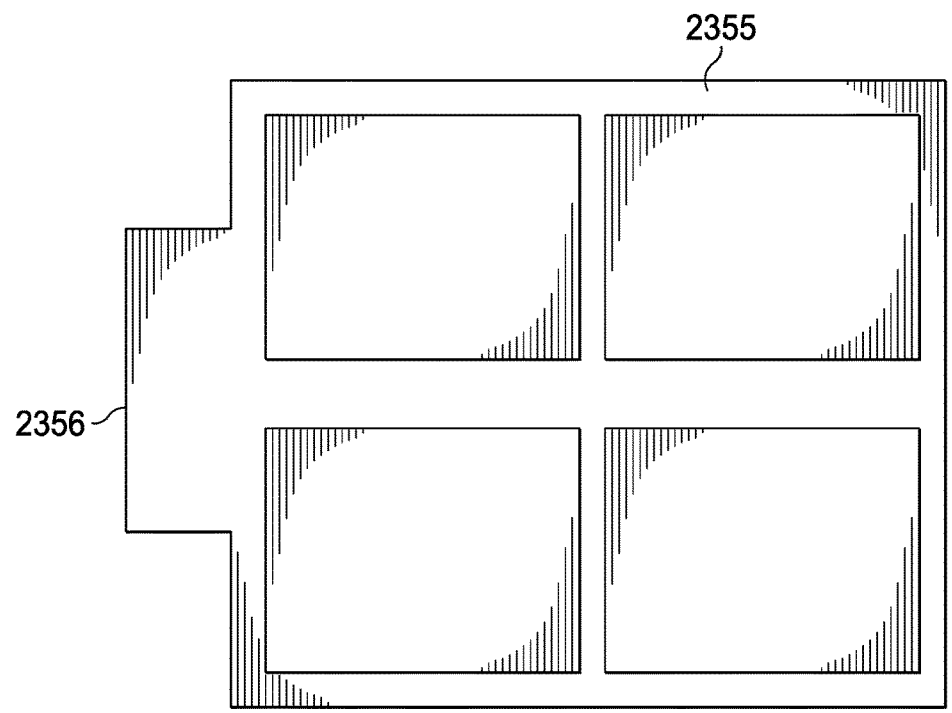
Figure 23I:
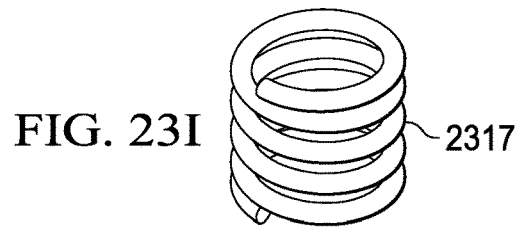
Figure 24A:
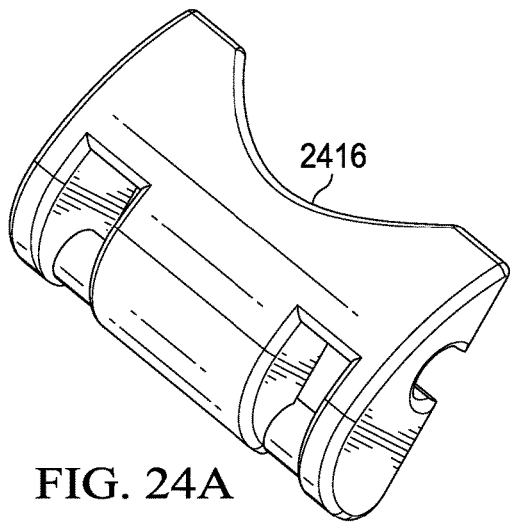
Figure 24B:
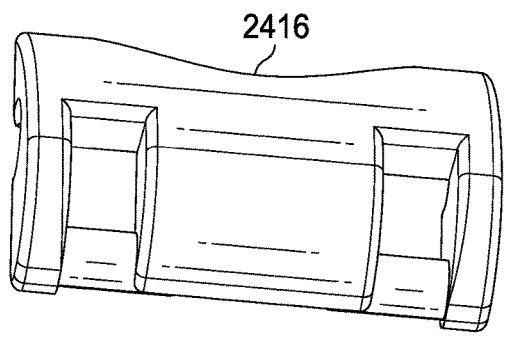
Figure 24C:
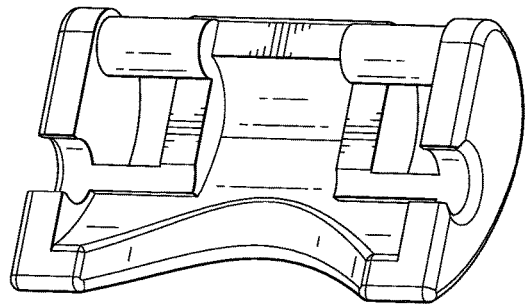
Figure 24D:
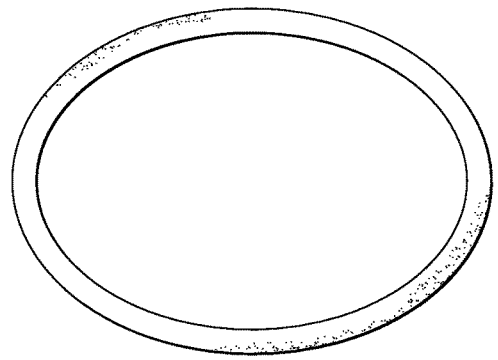
Figure 24E:
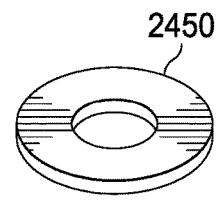
Figure 24F:
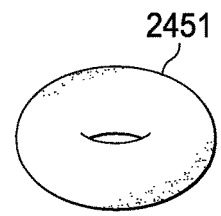
Figure 25A:
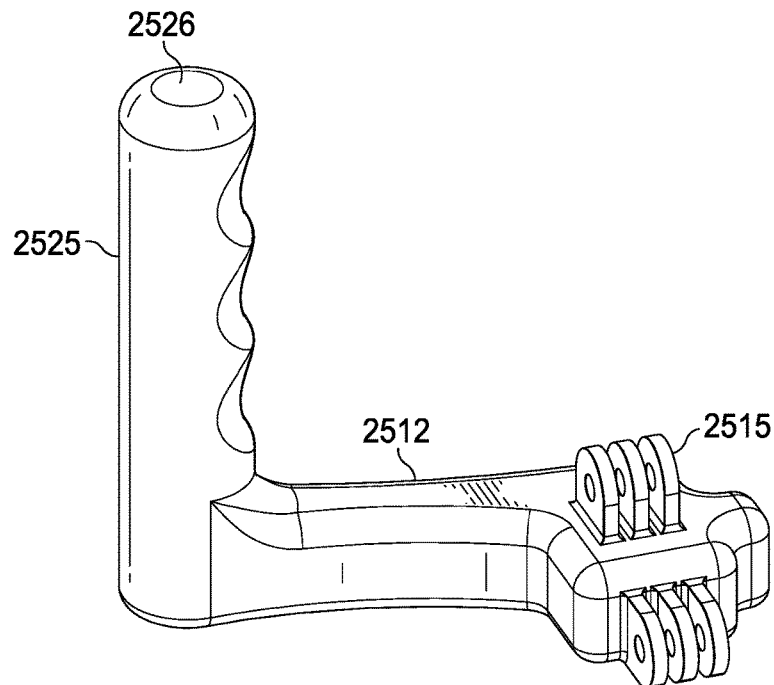
Figure 25B:
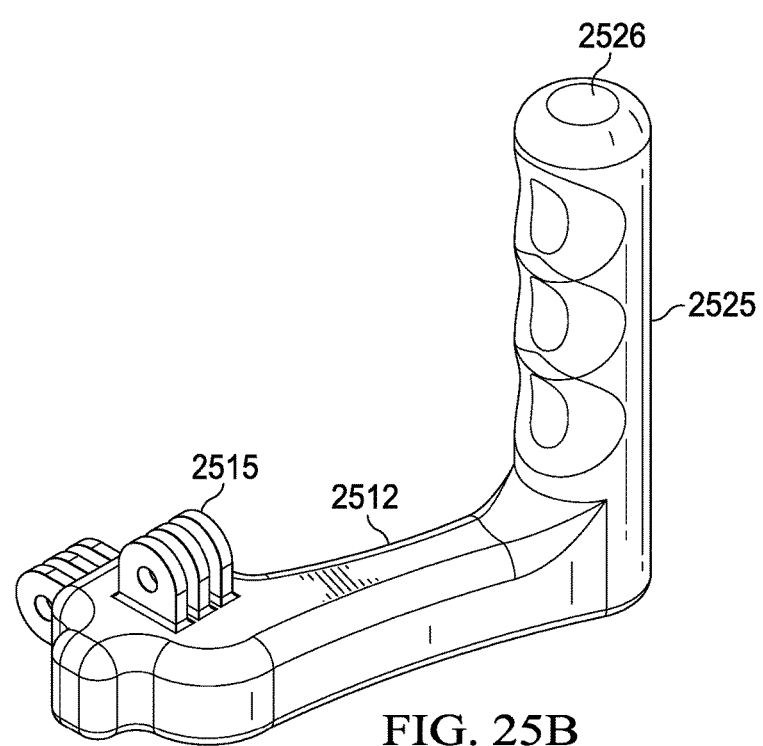
Figure 25C:
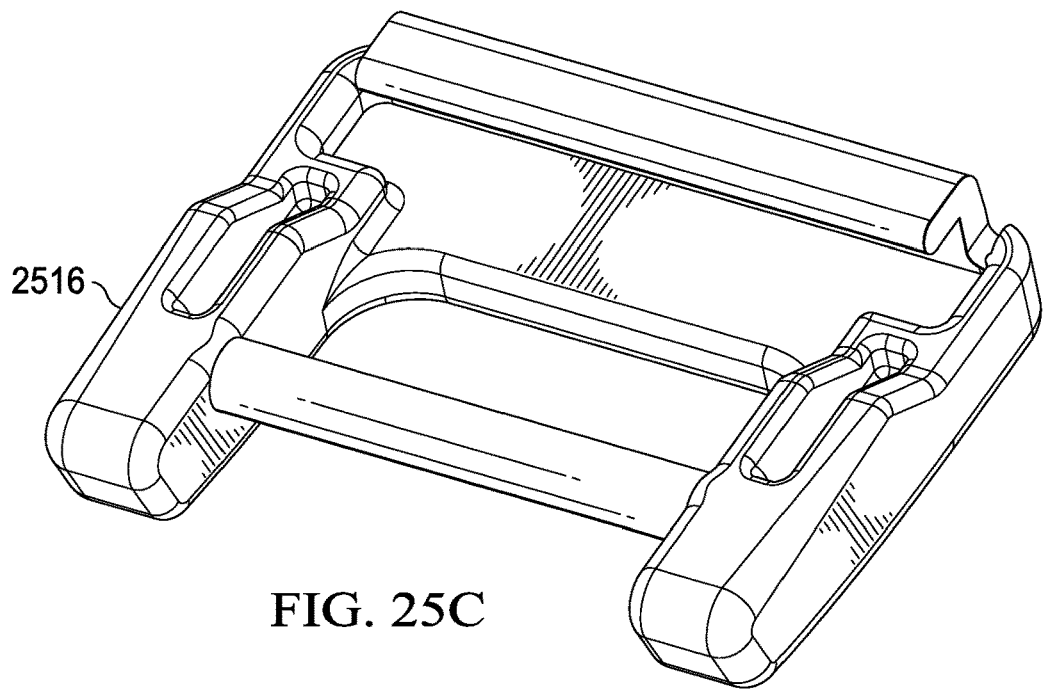
Figure 25D:
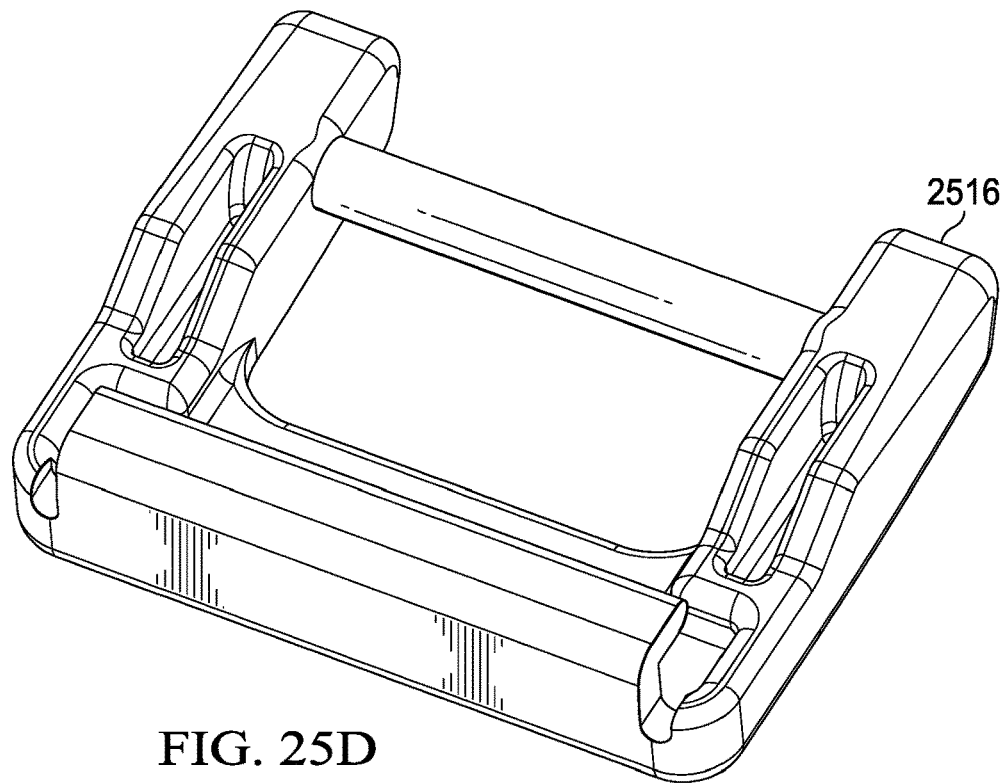
Figure 25E:
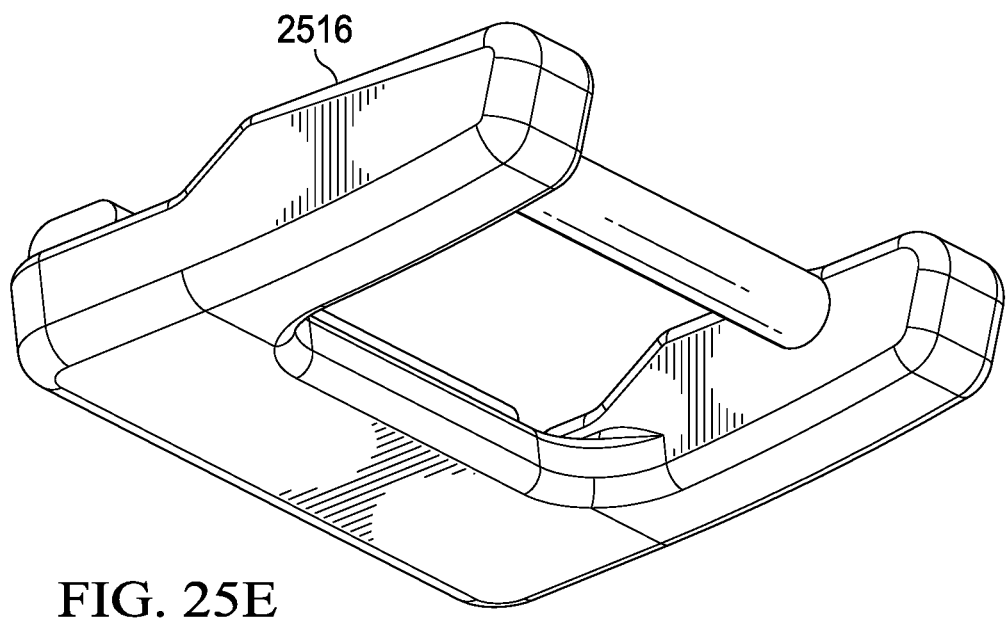
Figure 25F:
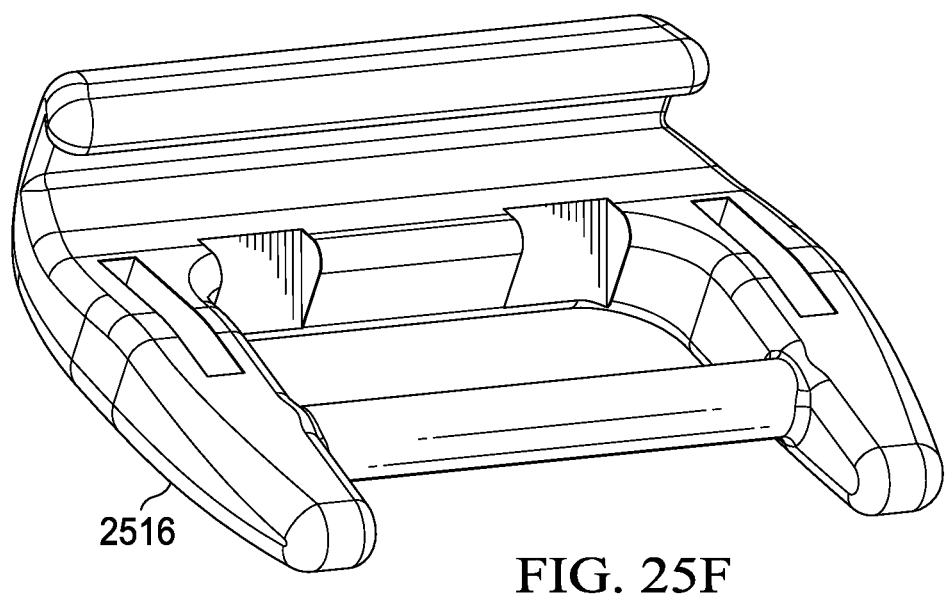
Figure 25G:
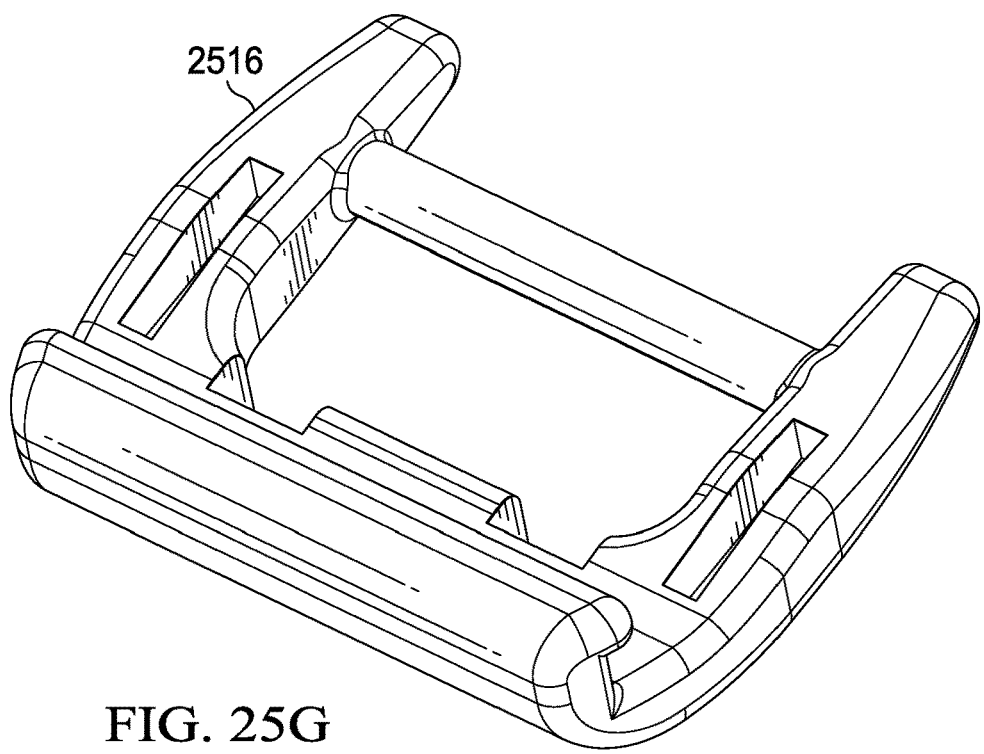
Figure 25H:
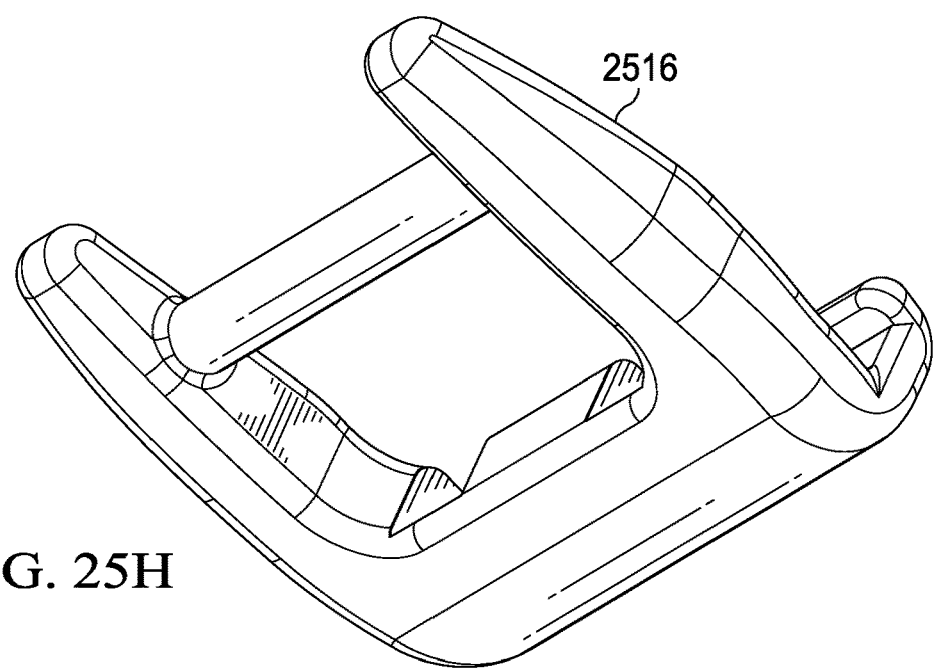

FIGS. 16F-G are isometric views of the push button assembly with spring, seals and clasp;

FIG. 16H is an isometric view of the housing casing seal;

FIGS. 17A-G are isometric views of the outer casing assembly with push buttons, filters, seals and latches assembled thereon;

FIGS. 18A-E are isometric views of the inner case assembly;

FIGS. 18F-I are isometric views of the outer casing latch assembly;

FIGS. 18J-L are isometric views of the connector division assembly;

FIGS. 18M-O are isometric views of interface pin connector;

FIGS. 19A-D are prior art cameras that can be used with the present invention;

FIGS. 19E-F are front and isometric views of foam pads used in the present invention;

FIGS. 19G-H are front and isometric views of foam lens pads used in the present invention;

FIGS. 19I-J are front and isometric views of the glass lens used in the present invention;

FIGS. 20A-C are isometric, front and rear views of the lens clamp assembly used in the present invention;

FIGS. 21A-D are isometric views of the bridge card assembly used in the present invention;

FIGS. 21E-F are isometric views of the bridge connector assembly used in the present invention;

FIGS. 21G-H are isometric views of the 3 prong connector assembly used in the present invention;

FIGS. 21I-L are isometric views of the pin-out connector bridge assemblies used in the present invention;

FIGS. 21M-N are isometric views of the supplemental battery storage unit and connector wires used in the present invention;

FIG. 21O is an isometric views of a long, medium and regular button pin used in the present invention;

FIG. 21P is an isometric view of a circuit clip pin used in the present invention;

FIGS. 22A-B are isometric views of a bridge connector used in the present invention;

FIGS. 23A-B are isometric views of the cap to the supplemental memory chip internal storage unit used in the present invention;

FIGS. 23C-F are isometric views of the supplemental memory chip internal storage unit used in the present invention;

FIGS. 23G-H are isometric views of the supplemental memory chip (SSD-type) used in the present invention;

FIG. 23I is an isometric view of a spring assembly used in the present invention;

FIGS. 24A-C are isometric views of the latch button assembly used in the present invention;

FIG. 24D is an isometric view of a lens O-ring assembly used in the present invention;

FIG. 24E is an isometric view of a nylon washer assembly used in the present invention;

FIG. 24F is an isometric view of a lens O-ring push button assembly used in the present invention;

FIGS. 25A-B are isometric views of an external mountable handle on the outer casing used in the present invention;

FIGS. 25C-E are isometric views of a lower clip body mountable on the outer casing used in the present invention; and, FIGS. 25F-H are isometric views of an upper main clip body mountable on the outer casing used in the present invention.

DETAILED DESCRIPTION

The present invention is a supplemental waterproof housing that completely surrounds the unit and housing of a camera device, which may be a single shot film, digital video device, photographic camera, or digital video recorder. In addition to the outer waterproof housing, the present invention encloses an integrated and removable supplemental external battery and supplemental memory storage inside the external housing, and a mounting point for lenses, filters or adaptors and handles attached to outside to the external housing.

The internal compartment of the housing encloses an inner housing that holds the camera, and allows easy connections to the removable memory chips and removable battery packs through coupling adapters, connectors and bridges, which is all integrated into and enclosed by the external housing. The present invention also allows access to the internal compartment with one side of the inner housing providing a seal on one side of the waterproof housing, which is secured through waterproof seals, couplings and latches on the outside of the housing. Waterproof seals are also located on the housing and actuation pins that operate corresponding dials and buttons on the camera device, which means the housing does not need to be opened to operate the camera or video device.

The invention supports a lens of the camera that has a lens, filter or adaptor to it which allows an integrated mounting for these accessories. The invention also includes a camera housing that takes the place of the lens cap. There is no need to protect the lens if it is enclosed in the case, which means the present invention includes a housing that protects the optical glass window in the case. The present invention also incorporates an attachment couplings for a lens filter, lens hood, lens cap or adaptor into the part of the environmentally sealed housing that holds the optical glass window in place. The present invention also includes a housing for a supplemental battery pack and supplemental memory storage.

The present invention also includes a housing for a supplemental battery pack and supplemental memory storage. The following embodiments introduce new construction concepts for an environmentally sealed camera housing. The preferred embodiment integrates the threaded socket for the accessories into the retention element for the optical glass A1.

Figure 1A:
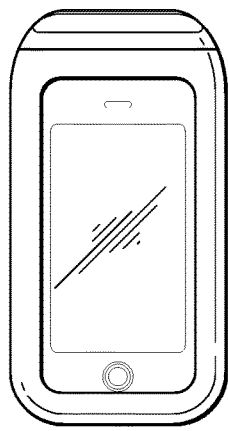
FIGS. 1A-1G are prior art configurations described herein.
Figure 1B:
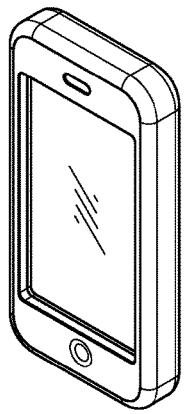
Figure 1C:
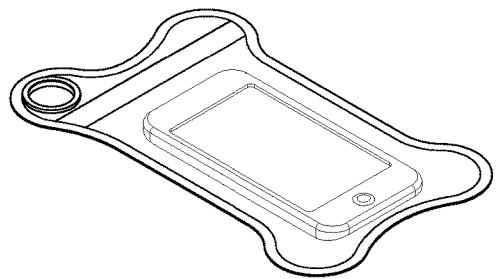
Figure 1D:
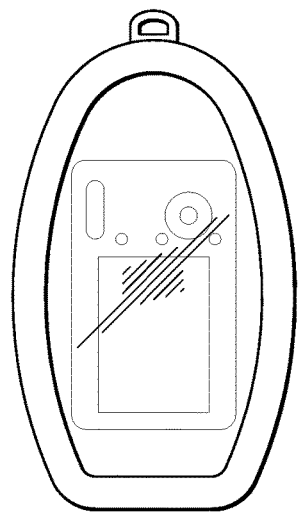
Figure 1E:
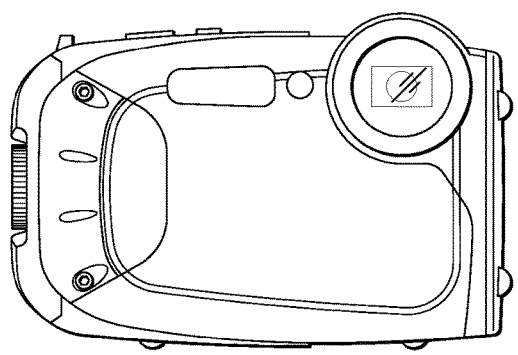
Figure 1F:
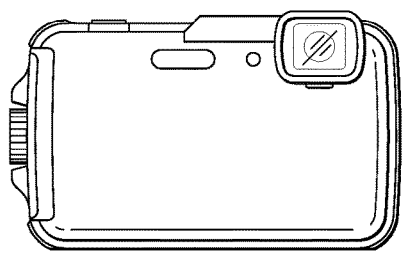
Figure 1G:
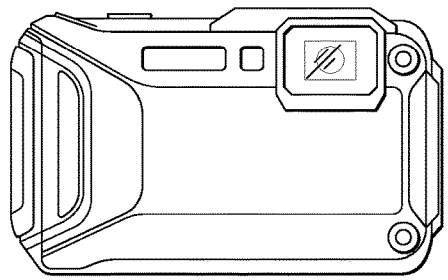
Figure 1H:
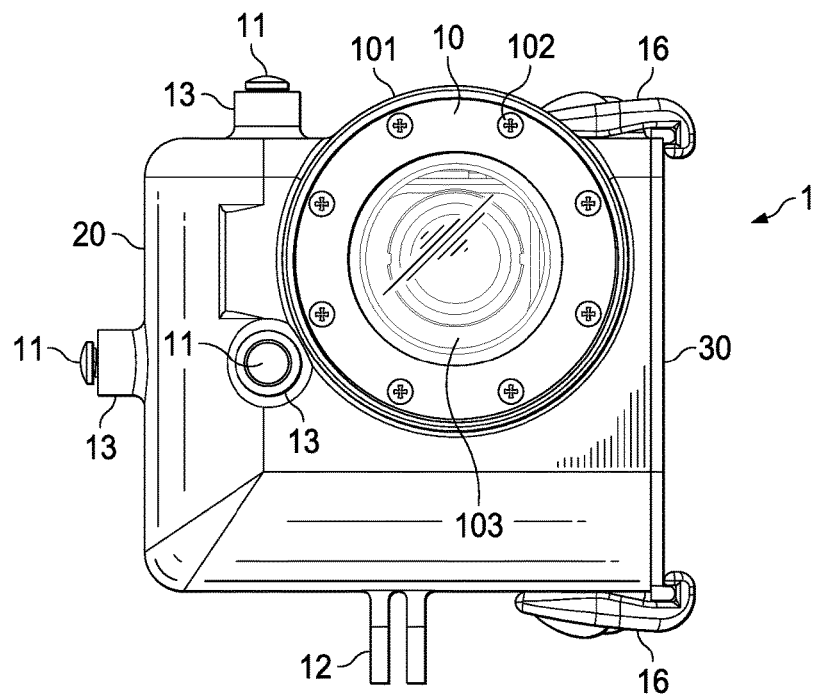
FIG. 1H is a front view of the assembled invention.
Figure 2:
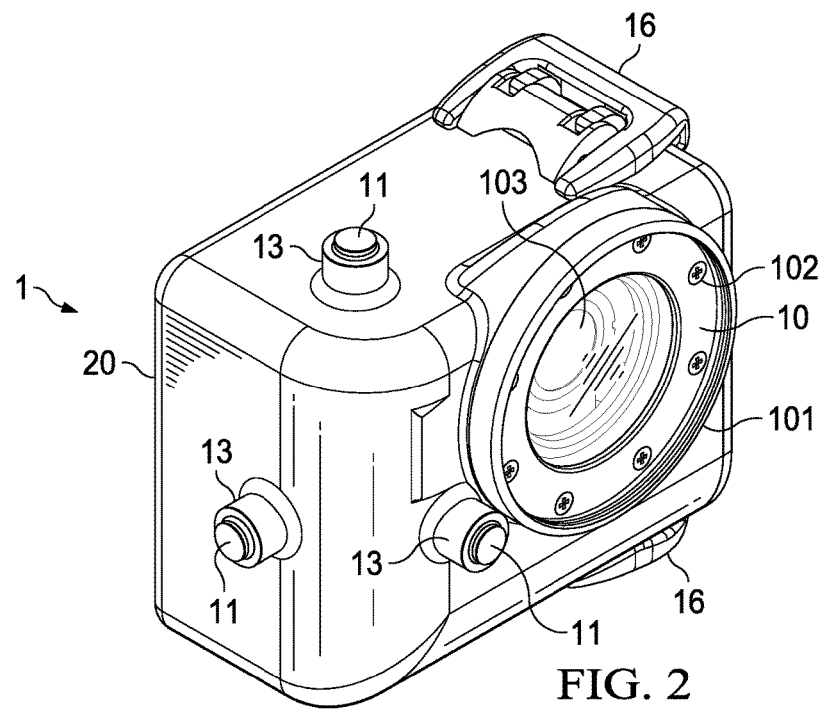
FIG. 2 is a perspective isometric view of the assembled invention.

FIGS. 1H and 2 are front and isometric perspective views of the assembled invention 1 showing two elements: the exterior supplemental camera housing (20), and the interior carrier (30) that holds a camera or video recorder as well as other accessories and also creates a cover for the housing (20). A third element is an optical window assembly (10) with threaded accessory receiver (101) that when coupled with the assembly of the housing (20) and carrier (30) forms the present invention. As shown in FIG. 2, the threaded accessory receiver (101) of the optical window assembly (10) can be seen. An optical lens 103 is located at the center aperture of the optical window assembly 10.

The optical assembly 10 is fastened to the camera housing with mechanical fasteners (102). The optical lens 103 is be held in place by screws or mechanical fasteners 102, but could also be held in place by an adhesive or a gasket, which would eliminate the need for a mechanical fastener 102. The retention is improved with the addition of a threaded socket (101) that accessories may be mounted to. The threaded socket (101) may be a standard diameter and use a standard thread pitch to accommodate standard devices or may be a custom diameter and use a custom attachment method for non-standard devices.

The retention ring 10 is fastened to the camera housing with mechanical fasteners (102)*m* but retention can be improved with the addition of a threaded socket (101) that accessories may be mounted to. The threaded socket (101) may be a standard diameter and use a standard thread pitch to accommodate standard devices or may be a custom diameter and use a custom attachment method for non-standard devices.

Latches 16 secured the exterior plate of the interior carrier 30 to the remainder of the external housing 20, which seals and prevent water leakage after the latches 16 are engages. The mounting bracket 12 is located on the bottom of housing 20. There are also three buttons 11 shown in the sealed button housings 13 for use in operating the functions of the camera located inside the housing 20 and interior carrier 30, including button locations on the top, side and front of the housing 20.

Figure 3:
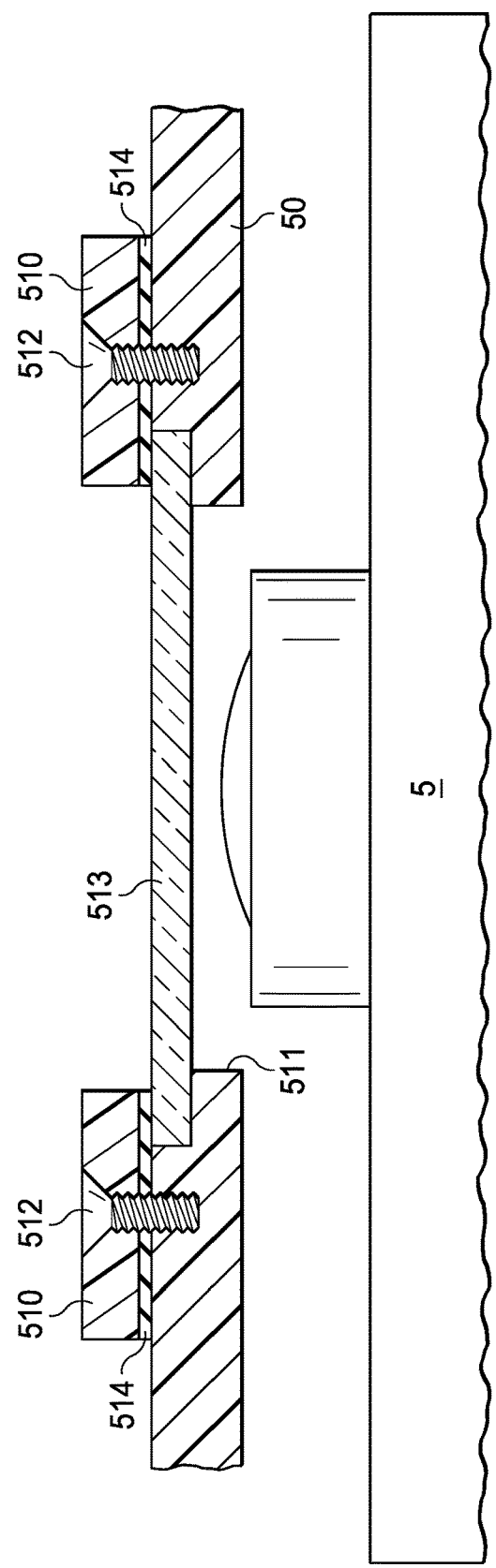
FIG. 3 is a cross sectional view of the non-waterproof lens found in the prior art.

FIG. 3 depicts a cross section through an example of the prior art, where a fixed optical window 513 is compressed onto a camera housings (50) to form a window (511) for the camera (5) to view the target image. The window (511) is sealed with an optical element (513), which is held in place by a retention component (510) held in place by screws 512. A gasket (514) underlying retention component 510 seals the optical element (513) and camera housing (50) by mechanical fasteners (512).

Figure 4:
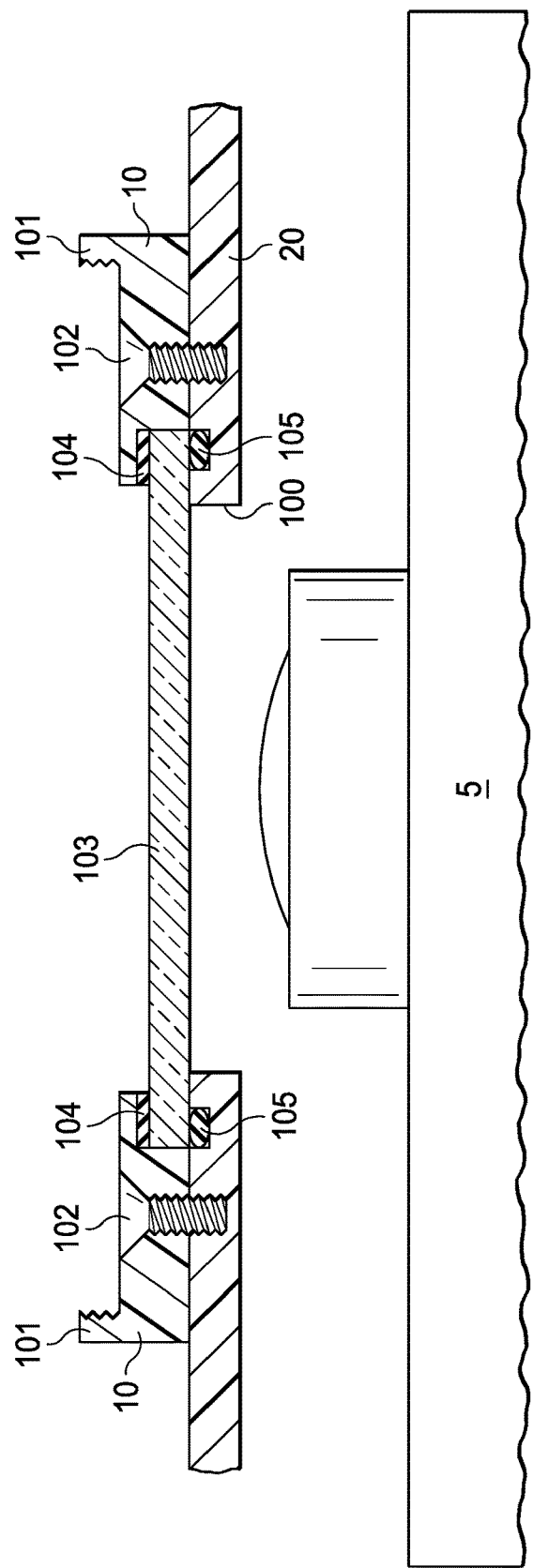
FIGS. 4-6 are cross sectional views of the lens and filter used in the present invention.

FIG. 4 shows a cross section of the preferred embodiment of the present invention enclosing a camera 5. The optical window assembly (10) is comprised of an optical element (103) held in place over the optical window (100) by a retention ring (10). The optical window (100) is sealed against the outside elements by an O-ring (105) compressed between the optical element (103) and the camera housing (20). The optical element is cushioned against shock and misalignment by a $2^{nd}$ gasket (104) located on the exterior of the optical element 103.

The optical window assembly 10 is fastened to the camera housing 20 with mechanical fasteners (102). The retention is improved with the addition of a threaded socket (101) that accessories may be mounted to. The threaded socket (101) may be a standard diameter and use a standard thread pitch to accommodate standard devices or may be a custom diameter and use a custom attachment method for non-standard devices.

Figure 5:
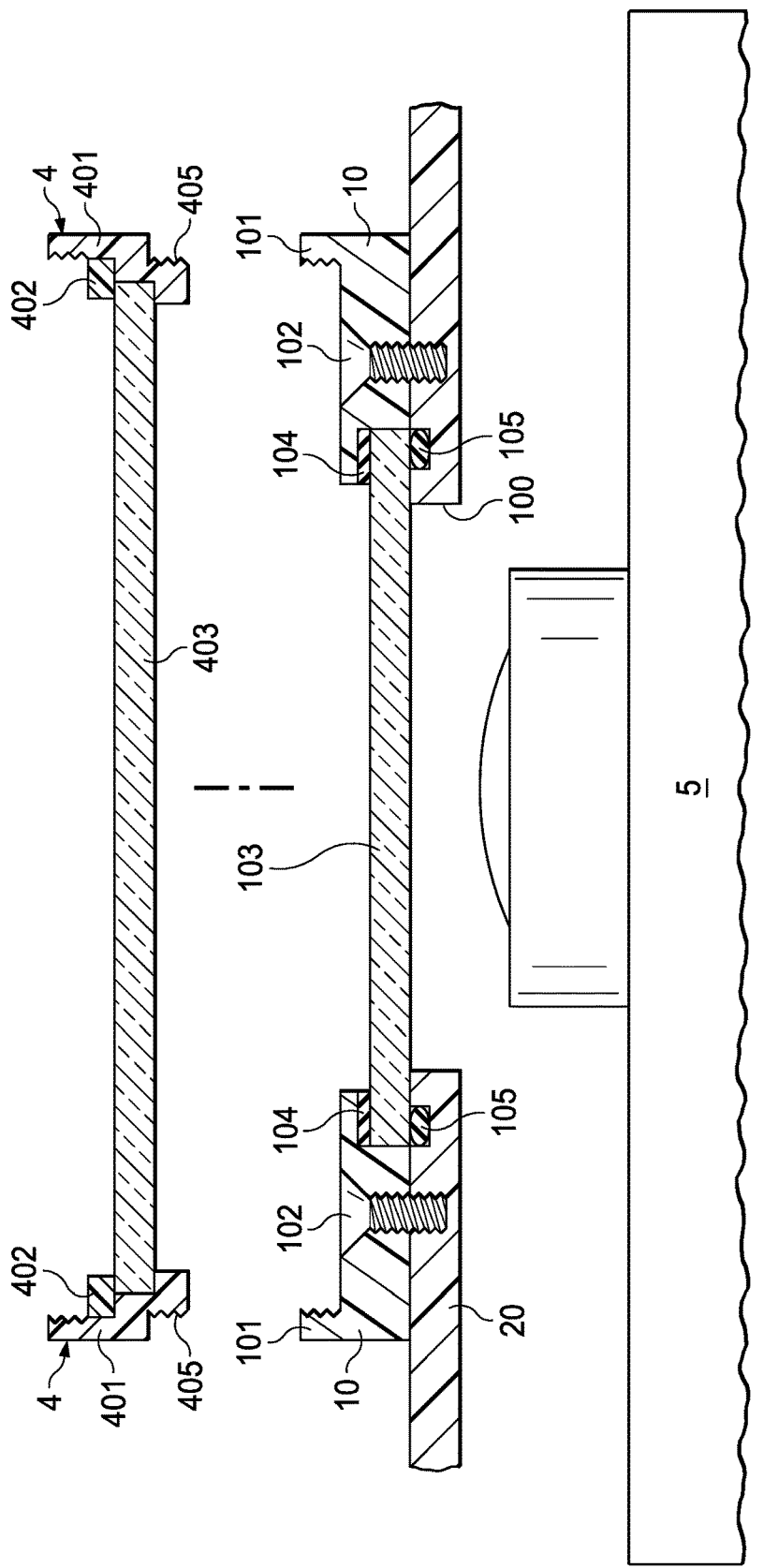

FIG. 5 shows a cross section of the preferred embodiment of the present invention enclosing a camera 5. The optical window assembly (10) is comprised of an optical element (103) held in place over the optical window (100) by a retention ring (10). The optical window (100) is sealed against the outside elements by an O-ring (105) compressed between the optical element (103) and the camera housing (20). The optical element is cushioned against shock and misalignment by a $2^{nd}$ gasket (104) located on the exterior of the optical element 103.

Figure 6:
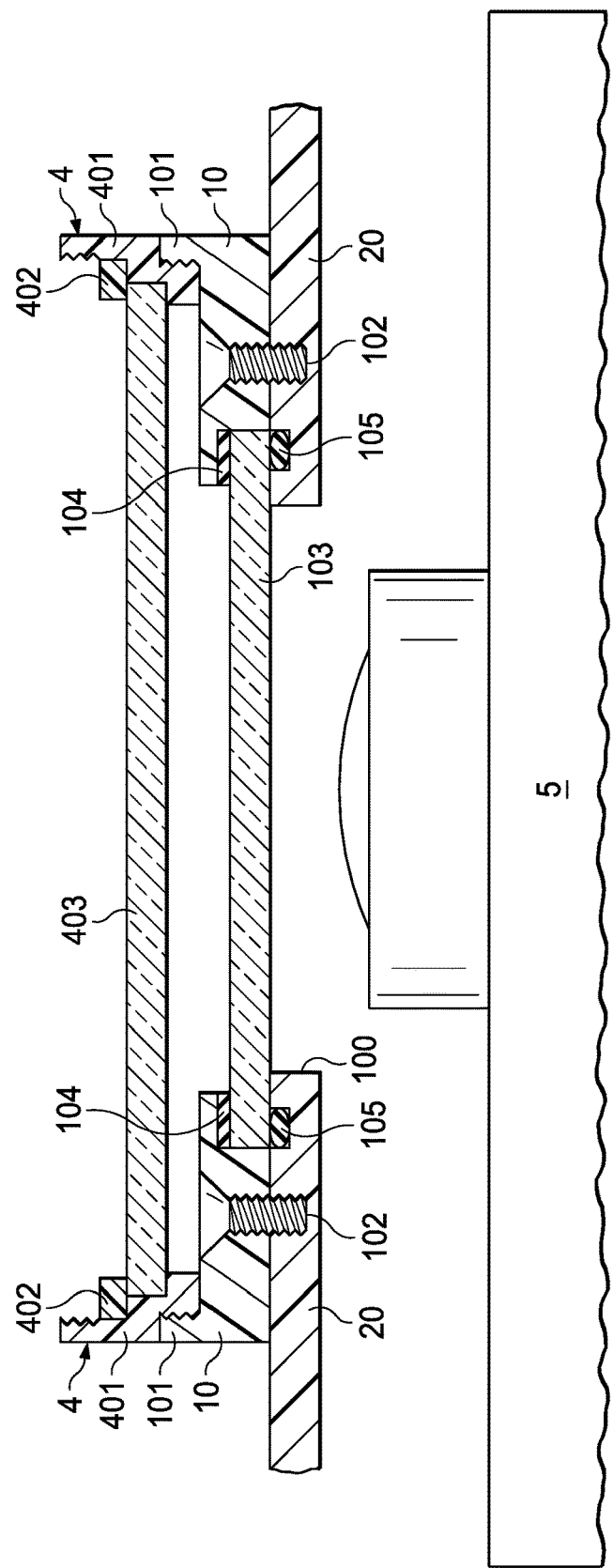

The optical window assembly 10 is fastened to the camera housing 20 with mechanical fasteners (102). The retention is improved with the addition of a threaded socket (101) that accessories may be mounted to. The threaded socket (101) may be a standard diameter and use a standard thread pitch to accommodate standard devices or may be a custom diameter and use a custom attachment method for non-standard devices. Additionally, FIG. 5 shows the cross section of a lens filter (4) having an optical filter element (403) held in place by a support ring (401) with a retention element (402). The lens filter (4) is secured to the threads 101 on the housing 20 by threads (405). FIG. 6 depicts the lens filter (4) assembled with the housing 20 as threaded into the socket (101).

Figure 7:
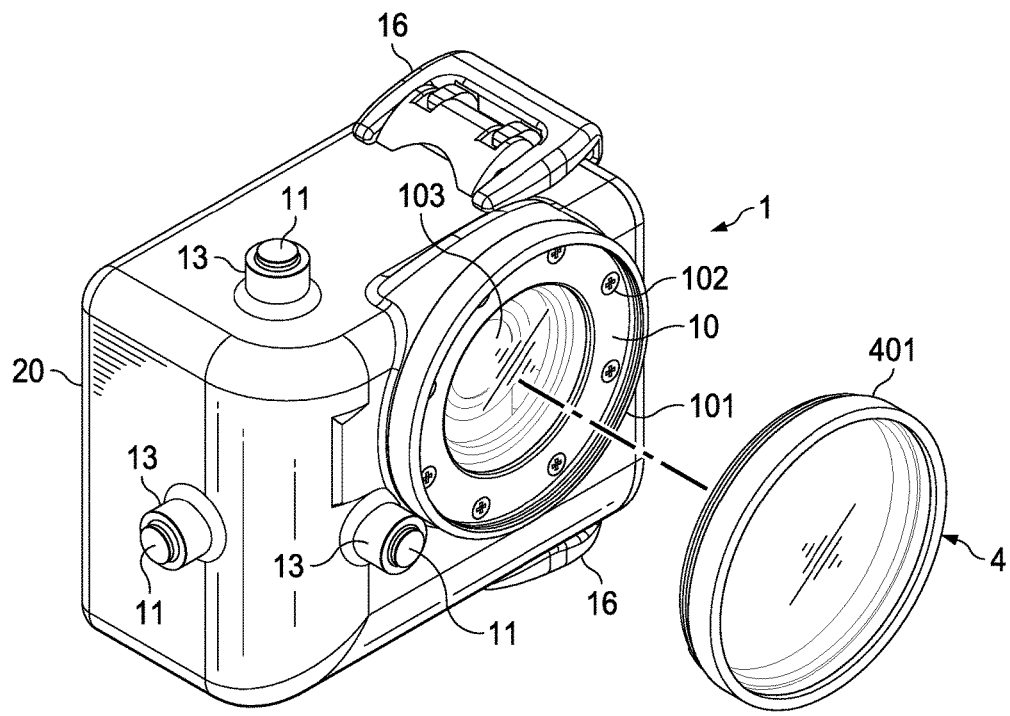
FIGS. 7-14 are perspective isometric views of the present invention with a filter, supplemental lens, sun hood, and lens cap.
Figure 8:
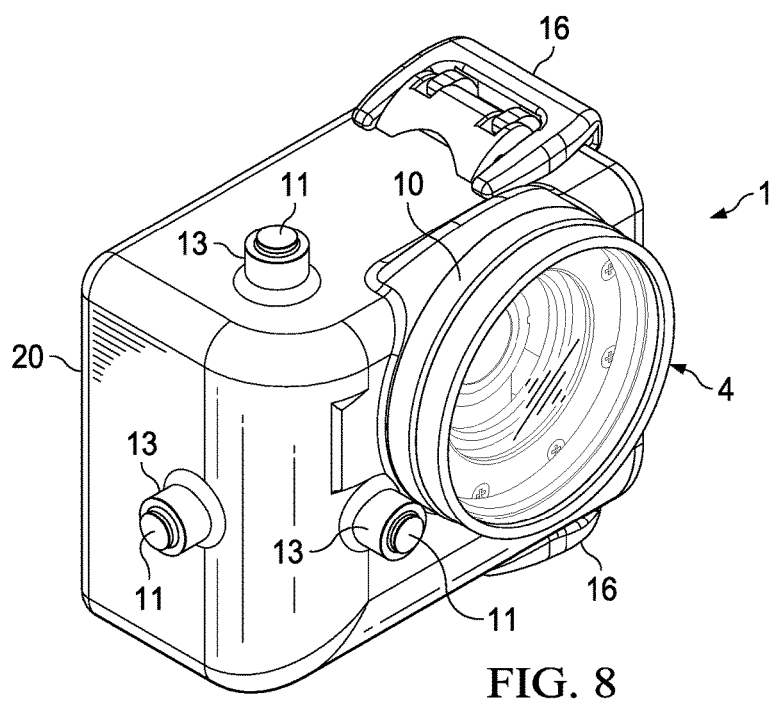

FIG. 7 depicts an isometric view of the cross section of FIG. 5, and FIG. 8 depicts an isometric view of the cross section of FIG. 6. As shown in FIGS. 7 and 8, an optical window assembly (10) with threaded accessory receiver (101) that when coupled with the assembly of the housing (20) and carrier (30) forms the present invention. The threaded accessory receiver (101) of the optical window assembly (10) can be seen, and an optical lens 103 is located at the center aperture of the optical window assembly 10. The optical lens 103 is be held in place by screws or mechanical fasteners 102, but could also be held in place by an adhesive or a gasket, which would eliminate the need for a mechanical fastener 102. The retention is improved with the addition of a threaded socket (101) that accessories may be mounted to.

The exterior supplemental camera housing (20) is shown with latch 16 secured the exterior plate of the interior carrier 30 to the remainder of the external housing 20, which seals and prevent water leakage after the latches 16 are engages. The mounting bracket 12 is located on the bottom of housing 20. There are also buttons 11 shown in the sealed button housings 13 for use in operating the functions of the camera located inside the housing 20 and interior carrier 30, including button locations on the top, side and front of the housing 20. The lens filter (4) has an optical filter element held in place by a support ring (401) with a retention element, and the lens filter (4) is secured to the threads 101 on the housing 20 by threads (405). FIG. 8 depicts the lens filter (4) assembled with the housing 20 as threaded into the socket (101).

Figure 9:
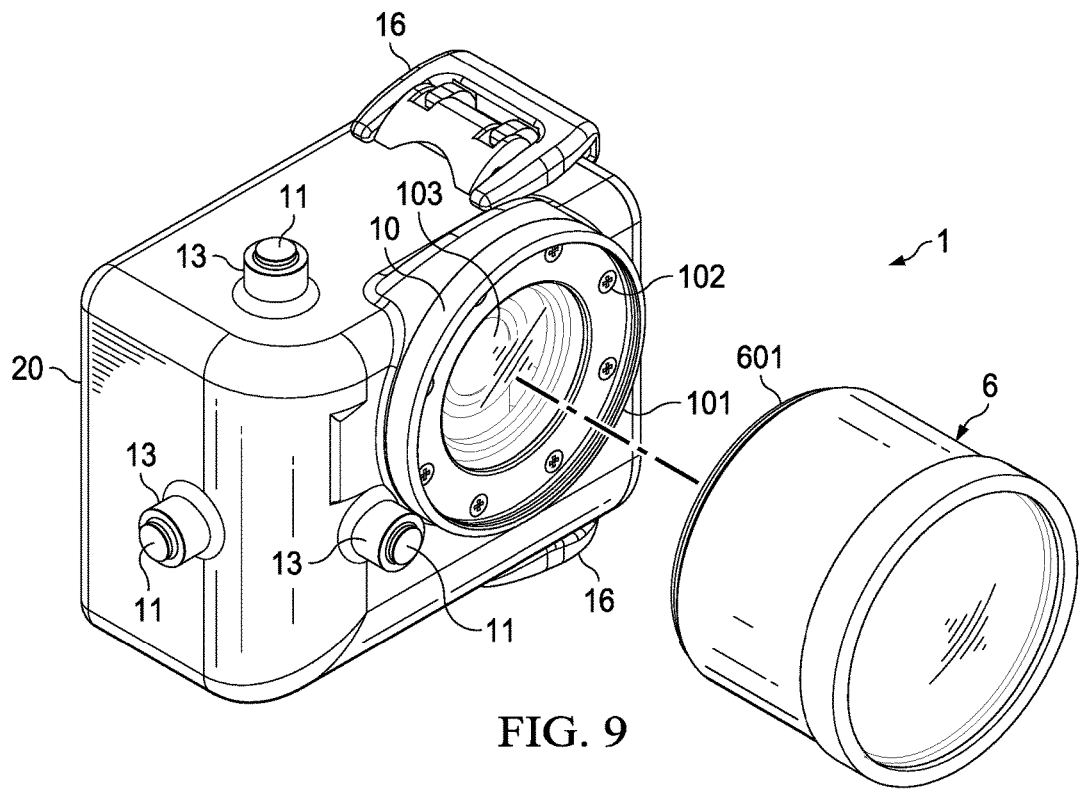
Figure 10:
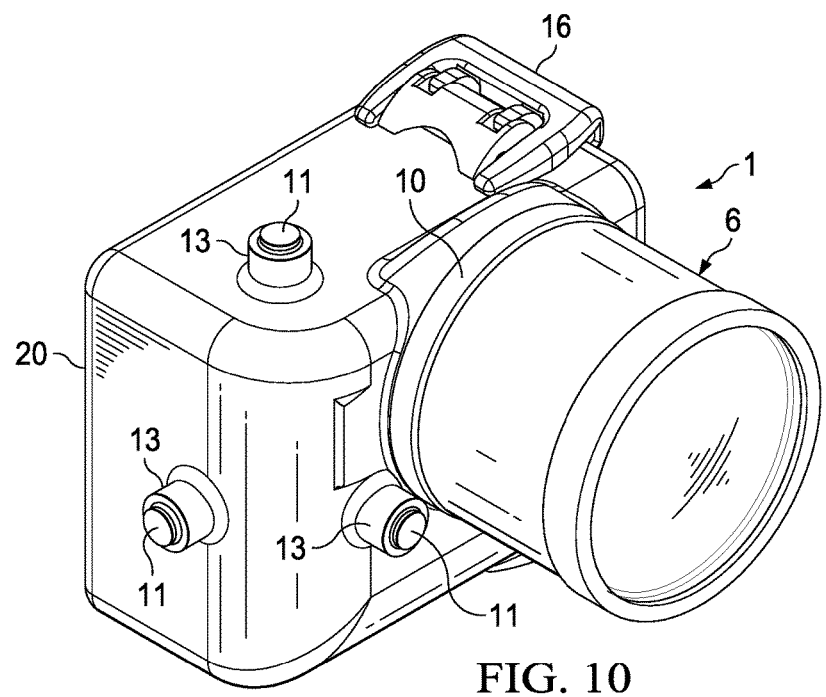

FIG. 9 depicts an isometric view of the present invention (1) with an lens adapter (6). The lens adapter (6) has a threaded ring (601) that screws into the threaded socket (101) of the present invention. FIG. 10 depicts the lens adapter (6) of FIG. 9 mounted on the preferred embodiment of the present invention. As shown in FIGS. 9 and 10, an optical window assembly (10) with threaded accessory receiver (101) that when coupled with the assembly of the housing (20) and carrier (30) forms the present invention. The threaded accessory receiver (101) of the optical window assembly (10) can be seen, and an optical lens 103 is located at the center aperture of the optical window assembly 10. The optical lens 103 is be held in place by screws or mechanical fasteners 102, but could also be held in place by an adhesive or a gasket, which would eliminate the need for a mechanical fastener 102. The retention is improved with the addition of a threaded socket (101) that accessories may be mounted to.

The exterior supplemental camera housing (20) is shown with latch 16 secured the exterior plate of the interior carrier 30 to the remainder of the external housing 20, which seals and prevent water leakage after the latches 16 are engages. The mounting bracket 12 is located on the bottom of housing 20. There are also buttons 11 shown in the sealed button housings 13 for use in operating the functions of the camera located inside the housing 20 and interior carrier 30, including button locations on the top, side and front of the housing 20. As shown in FIG. 9, the lens adapter (6) has a threaded ring (601) that screws into the threaded socket (101) of the present invention. And, FIG. 10 shows the lens adapter (6) of FIG. 9 mounted on the preferred embodiment of the present invention.

Figure 11:
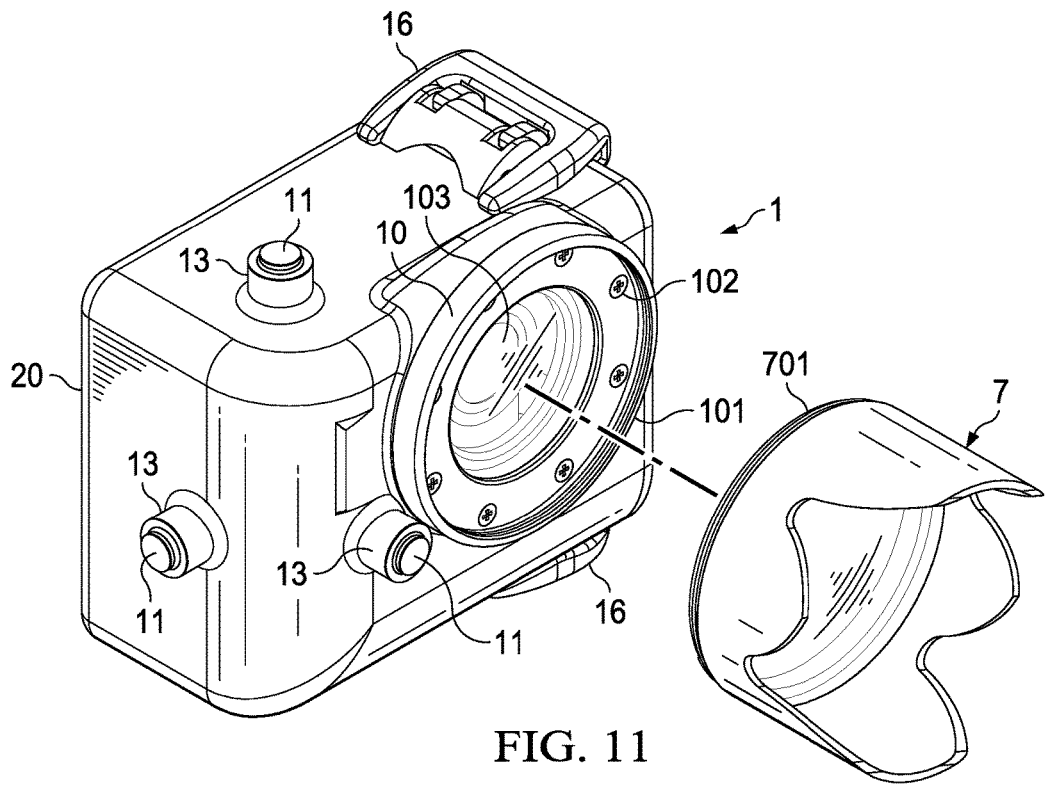
Figure 12:
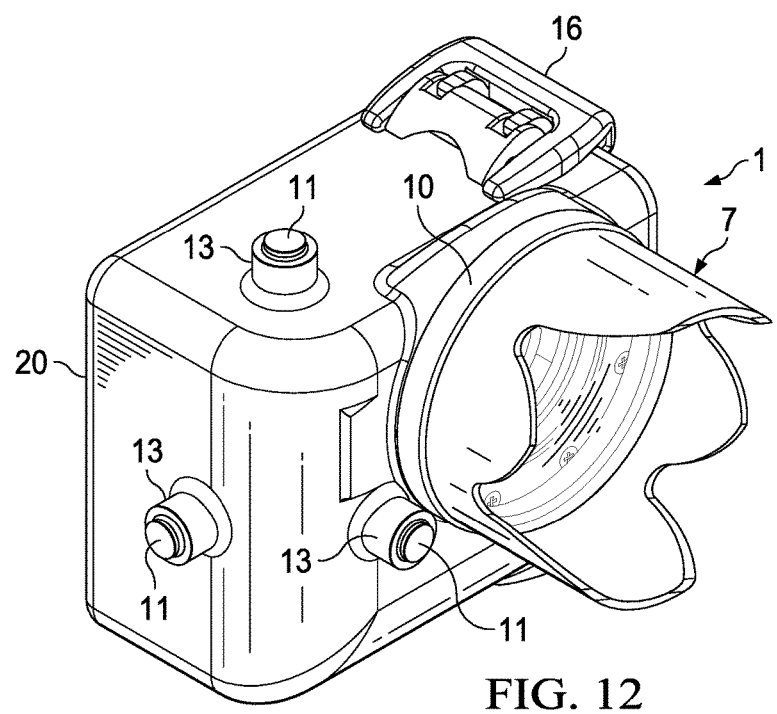

FIG. 11 depicts an isometric view of the present invention (1) with a lens hood (7) having a threaded ring (701) that screws into the threaded socket (101) of the present invention, and FIG. 12 depicts the lens hood (7) of FIG. 11 mounted on the preferred embodiment of the present invention. As shown in FIGS. 11 and 12, an optical window assembly (10) with threaded accessory receiver (101) that when coupled with the assembly of the housing (20) and carrier (30) forms the present invention. The threaded accessory receiver (101) of the optical window assembly (10) can be seen, and an optical lens 103 is located at the center aperture of the optical window assembly 10. The optical lens 103 is be held in place by screws or mechanical fasteners 102, but could also be held in place by an adhesive or a gasket, which would eliminate the need for a mechanical fastener 102. The retention is improved with the addition of a threaded socket (101) that accessories may be mounted to.

The exterior supplemental camera housing (20) is shown with latch 16 secured the exterior plate of the interior carrier 30 to the remainder of the external housing 20, which seals and prevent water leakage after the latches 16 are engages. The mounting bracket 12 is located on the bottom of housing 20. There are also buttons 11 shown in the sealed button housings 13 for use in operating the functions of the camera located inside the housing 20 and interior carrier 30, including button locations on the top, side and front of the housing 20. As shown in FIG. 11 depicts an isometric view of the present invention (1) with a lens hood (7) having a threaded ring (701) that screws into the threaded socket (101) of the present invention, and FIG. 12 depicts the lens hood (7) of FIG. 11 mounted on the preferred embodiment of the present invention.

Figure 13:
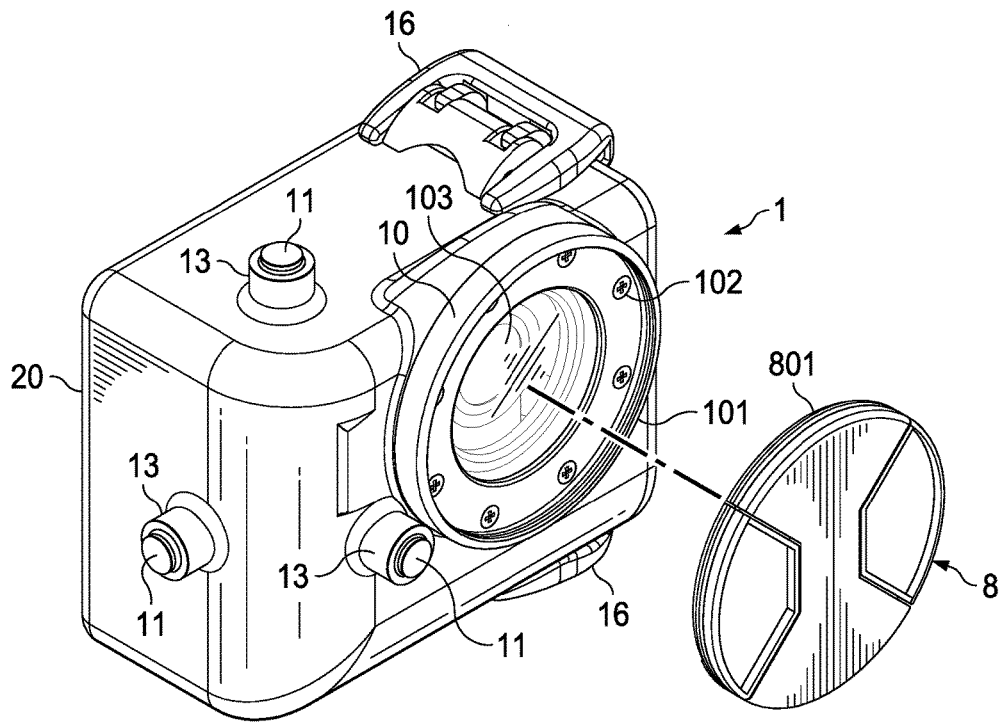
Figure 14:
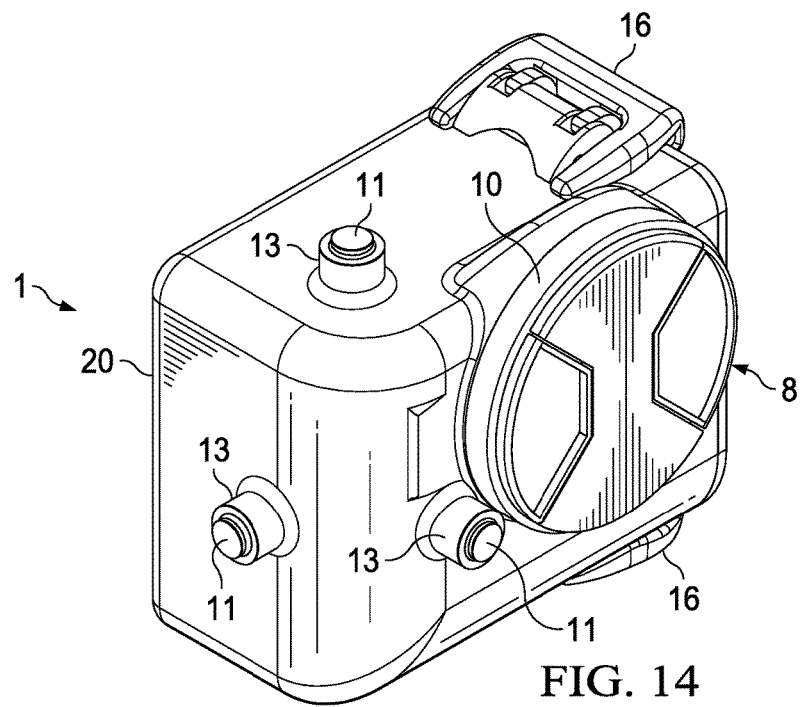

FIG. 13 depicts an isometric view of the present invention (1) with a lens cap (8) having a threaded ring (801) that screws into the threaded socket (101) of the present invention, and FIG. 14 depicts an isometric view of the present invention (1) with a Lens cap (8). The lens cap (8) has a threaded ring (801) that screws into the threaded socket (101) of the present invention. As shown in FIGS. 13 and 14, an optical window assembly (10) with threaded accessory receiver (101) that when coupled with the assembly of the housing (20) and carrier (30) forms the present invention. The threaded accessory receiver (101) of the optical window assembly (10) can be seen, and an optical lens 103 is located at the center aperture of the optical window assembly 10. The optical lens 103 is be held in place by screws or mechanical fasteners 102, but could also be held in place by an adhesive or a gasket, which would eliminate the need for a mechanical fastener 102. The retention is improved with the addition of a threaded socket (101) that accessories may be mounted to.

The exterior supplemental camera housing (20) is shown with latch 16 secured the exterior plate of the interior carrier 30 to the remainder of the external housing 20, which seals and prevent water leakage after the latches 16 are engages. The mounting bracket 12 is located on the bottom of housing 20. There are also buttons 11 shown in the sealed button housings 13 for use in operating the functions of the camera located inside the housing 20 and interior carrier 30, including button locations on the top, side and front of the housing 20. As shown in FIG. 13, the lens cap (8) has a threaded ring (801) that screws into the threaded socket (101) of the present invention, and FIG. 14 depicts an isometric view of the present invention (1) with a Lens cap (8). The lens cap (8) has a threaded ring (801) that screws into the threaded socket (101) of the present invention.

Figure 15:
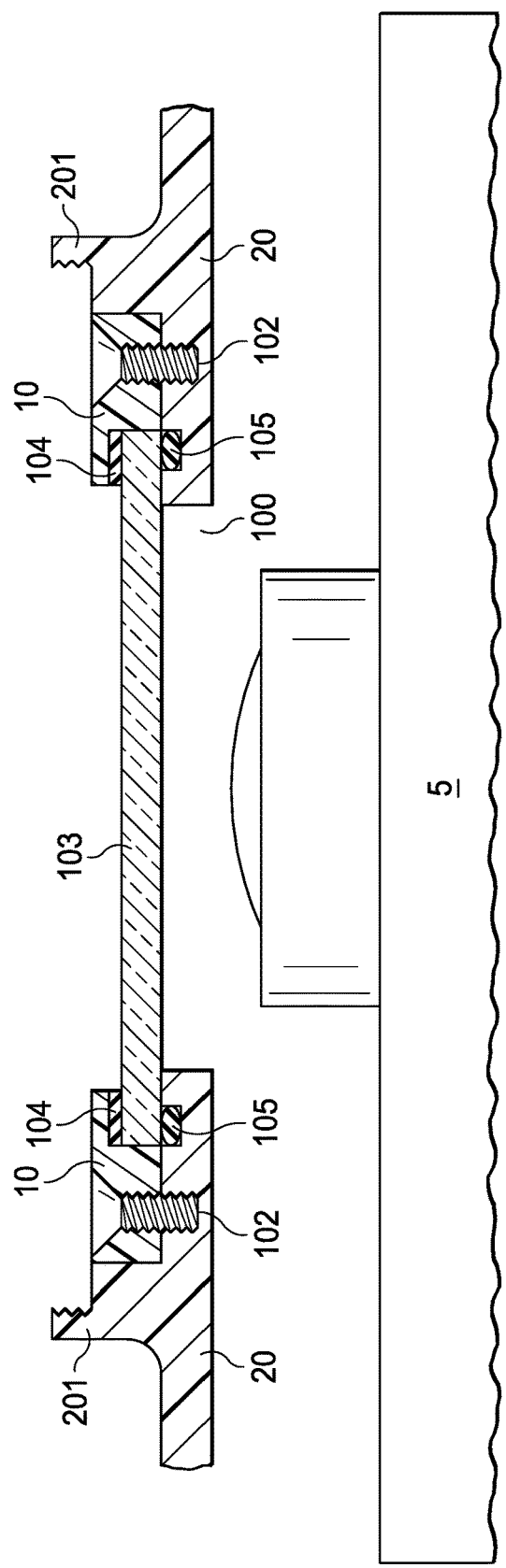
FIG. 15 depicts a first alternative housing of the present invention.

FIG. 15 depicts a first alternative embodiment of the present invention. The threaded socket (201) is part of the camera housing (20). FIG. 15 shows a cross section of the preferred embodiment of the present invention enclosing a camera 5 with an optical window assembly (10) is comprised of an optical element (103) held in place over the optical window (100) by a retention ring (10). The optical window (100) is sealed against the outside elements by an O-ring (105) compressed between the optical element (103) and the camera housing (20). The optical element is cushioned against shock and misalignment by a $2^{nd}$ gasket (104) located on the exterior of the optical element 103.

An additional retention and housing lip structure provides improved water proof protection for the enclosed devices. The optical window assembly 10 is fastened to the camera housing 20 with mechanical fasteners (102). The retention is improved with the addition of a threaded socket (101) that accessories may be mounted to. The threaded socket (201) may be a standard diameter and use a standard thread pitch to accommodate standard devices or may be a custom diameter and use a custom attachment method for non-standard devices.

FIGS. 16A-16D are isometric views of the outer case housing used in the present invention with the external housing 1620 having a aperture window 1603 and a side aperture 1630 that receives the internal carrier. The threaded accessory receiver (1601) of the optical window assembly (1603) can be seen, and an optical lens is located at the center aperture of the optical window assembly 1610. The optical lens 1603 is be held in place by screws or mechanical fasteners 1602, but could also be held in place by an adhesive or a gasket, which would eliminate the need for a mechanical fastener 1602. The retention is improved with the addition of a threaded socket (1601) that accessories may be mounted to.

The exterior supplemental camera housing (1620) is shown with latch brackets 1636 which holds the latches. The mounting bracket 1612 is located on the bottom of housing 1620. There are also buttons that can be located in the sealed button housings 1613 for use in operating the functions of the camera located inside the housing 1620 and interior carrier, including button locations on the top, side and front of the housing 1620. An internal support bracket 1635 supports the movement of the interior carrier and puts the camera element in the proper position when positioned in the external housing 1620. FIGS. 19A-D are prior art cameras that can be used with the present invention. The electrical connections on this camera unit can be connected to the supplemental battery 1870 via connector 1871 and/or the additional memory unit shown in FIGS. 23G-H and housed through the electrical connectors described in FIGS. 18J-L, 18M-O, 21A-D, 21E-F, 21G-H, 21I-L, 21M-N, 22A-B, and 23A-H.

The push buttons and screens 1611 that can be placed in the push button housings 1613 are shown in FIGS. 16E-G. FIG. 16E is an isometric view of the pan head Phillip screw 1611*f*; and FIGS. 16F-G are isometric views of the push button assembly with push knob 1611, spring 1611*a*, seals 1611*b*, clasp 1611*c* and push rod 1611*d*. FIG. 16H is an isometric view of the housing casing seal that surrounds the exterior plate (shown and described in FIGS. 18A-D) of the interior carrier 30 to the remainder of the external housing 1620, which seals and prevent water leakage after the latches 1616 are engages.

FIGS. 17A-G are isometric views of the outer casing assembly with push buttons, filters, seals and latches assembled thereon. The isometric views in FIGS. 17A-G include the outer case housing 1720 having an aperture window 1703 and a side aperture 1730 that receives the internal carrier. The threaded accessory receiver (1701) of the optical window assembly (1703) can be seen, and an optical lens is located at the center aperture of the optical window assembly 1710. The optical lens 1703 is be held in place by screws or mechanical fasteners 1702, but could also be held in place by an adhesive or a gasket, which would eliminate the need for a mechanical fastener 1702. The retention is improved with the addition of a threaded socket (1701) that accessories may be mounted to.

As shown in FIGS. 17A-G, the exterior supplemental camera housing (1720) is shown with latch brackets 1736 which holds the latches. The mounting bracket 1712 is located on the bottom of housing 1720. There are also buttons 1711 that can be located in the sealed button housings 1713 for use in operating the functions of the camera located inside the housing 1720 and interior carrier, including button locations on the top, side and front of the housing 1720. An internal support bracket 1735 supports the movement of the interior carrier and puts the camera element in the proper position when positioned in the external housing 1720. The push buttons 1711 can be placed in the push button housings 1613.

As shown in FIGS. 17A-G, latches 1716 secure the exterior plate of the interior carrier 1730 to the remainder of the external housing 1720, which seals and prevent water leakage after the latches 1716 are engages. The mounting bracket 1712 is located on the bottom of housing 1720. An internal support bracket 1735 supports the movement of the interior carrier and puts the camera element in the proper position when positioned in the external housing 1720.

FIGS. 18A-E are isometric views of the inner or interior case assembly having an end plate 1745, upper and lower latch points 1746, a seal gasket area 1747, a supplemental battery compartment storage area 1755, an internal side plate 1752, an upper plate 1753 and a camera placement area 1751. The additional battery 1780 can be seen in FIGS. 18C and 18D, as coupled to the camera device through connectors 1781. There is also additional space 1765 shown in FIG. 18C-D.

FIGS. 18F-I are isometric views of the outer casing latch assembly 1716 having a latch clasp 1716a and a latch axle pivot assembly 1716b for engagement with the latch brackets 1636 shown in FIGS. 16A-D, which holds the latches securely in place to seal the side plate of the interior carrier shown in FIGS. 18A-E. As shown in FIGS. 18F-I, latches 1716 secure the exterior plate of the interior carrier 1730 to the remainder of the external housing 1720, which seals and prevent water leakage after the latches 1716 are engages. The mounting bracket 1712 is located on the bottom of housing 1720. An internal support bracket 1735 supports the movement of the interior carrier and puts the camera element in the proper position when positioned in the external housing 1720.

FIGS. 24A-C are isometric views of the latch button assembly used in the present invention; FIGS. 25C-E are isometric views of an alternative embodiment of the lower latch clip body mountable on the outer casing used in the present invention; and, FIGS. 25F-H are isometric views of an alternative embodiment of an upper main clip body mountable on the outer casing used in the present invention. The outer casing latch assembly 2416 and 2516 having a latch clasp and a latch axle pivot assembly for engagement with the latch brackets 1636 shown in FIGS. 16A-D, which holds the latches securely in place to seal the side plate of the interior carrier shown in FIGS. 18A-E.

Internal electronic components are shown in FIGS. 18J-L as isometric views of the connector division assembly 1810 having prong pins 1819, side slots 1822, back pin-outs 1815 and prongs 1817. FIGS. 18M-O are isometric views of interface pin connector 1835 having an aligned pin receiver 1837 and a bottom pin-out 1839. FIGS. 21A-D are isometric views of the bridge card assembly on board 2301 having assembled connector division assembly 2010 (having prong pins 2019, prongs 2017) and interface pin connector 2035, three prong connector 2107, and pin out connector 2187 (having pin-outs 2190) and bridge pin out connector 2175. FIGS. 21E-F are isometric views of the bridge connector assembly 2155 used in the present invention; FIGS. 21G-H are isometric views of the 3 prong connector assembly 2107 used in the present invention; and FIGS. 21I-L as isometric views of the pin-out connector bridge assemblies 2187 (having pin outs 2190) and 2178 (having plates 2178 and pin outs 2176) used in the present invention. FIGS. 21M-N are isometric views of the supplemental battery storage unit 2180 and connector wires 2182 used in the present invention. FIGS. 22A-B are isometric views of a bridge connector board 2301 used in the present invention.

FIGS. 23A-B are isometric views of the cap 2301 in the supplemental memory chip internal storage unit used in the present invention having screw ports 2302 and 2303. FIGS. 23C-F are isometric views of the supplemental memory chip internal storage unit used in the present invention with a compartment 2310 and screw receiver areas 2313 and 2312. FIGS. 23G-H are isometric views of the supplemental memory chip (SSD-type) placed in compartment 2310 and used in the present invention.

FIGS. 19E-F are front and isometric views of foam pads 1901 and 1902 used in the present invention, and FIGS. 19G-H are front and isometric views of foam lens pads 1903 used in the present invention. FIGS. 19I-J are front and isometric views of the glass lens 1905 used in the present invention, and FIGS. 20A-C are isometric, front and rear views of the lens clamp assembly 2010 (showing screw ports 2002 and threads 2001) used in the present invention.

FIG. 21O is an isometric views of a long, medium and regular button pin (push rods 2162 and push knob 2117) used in the present invention, and FIG. 21P is an isometric view of a circuit clip pin 2118 used in the present invention. FIG. 23I is an isometric view of a spring assembly 2317 used in the present invention. FIG. 24D is an isometric view of a lens O-ring assembly used in the present invention; FIG. 24E is an isometric view of a nylon washer assembly 2450 used in the present invention; and, FIG. 24F is an isometric view of a lens O-ring push button assembly 2451 used in the present invention.

As an additional feature, FIGS. 25A-B are isometric views of an external mountable handle 2525 on the outer casing used in the present invention having a push button actuator 2526, a fixation latch 2515 and a handle body 2512.

We claim as follows:

1. An external waterproof housing for a camera unit, comprising:
   an external housing having an internal compartment, a top wall, bottom wall, a front wall, a rear wall, and at least one side wall with a side aperture to receive a removable inner carrier, and a top push button actuator positioned on the top wall of said external housing, a side push button actuator positioned on said at least one side wall of said external housing, and a front push button actuator positioned on the front wall of the external housing, said first, second and third actuators being used for external operation of the camera unit, the camera unit being located in the internal compartment of the external housing;
   said front wall of the external housing having an optical window assembly secured thereto and positioned adjacent a lens of the camera unit, said optical window assembly having a retention ring, an optical lens positioned at the center of the retention ring, a gasket positioned between the retention ring and the optical lens, and an O-ring positioned between the optical lens and the front wall of the external housing, said optical window assembly secured by a plurality of fasteners to the front wall of the external housing;
   said removable inner carrier being inserted into the internal compartment of the external housing through the side aperture, said removable inner carrier supporting the camera unit located in the internal compartment of the external housing, said removable inner carrier having:
   a. a supplemental battery unit and first battery connector;
   b. a supplemental memory storage unit and first memory storage connector; and,
   c. a camera unit enclosure area;

said camera unit being connected to the supplemental battery unit through first battery connector and said camera unit being connected to the supplemental memory storage unit through the first memory storage connector;

said removable inner carrier having at least one end with an end plate, said end plate secured to said external housing to cover said side aperture, seal the internal compartment, and make the external housing watertight;

a first latch located on the top wall and a second latch located on the bottom wall of the external housing, said first and second latches being positioned over a portion of the end plate and said first and second latches latching, in a waterproof-sealed engagement, the end plate of said removable inner carrier into the side aperture of the external housing;

a first mounting point located on the optical window assembly of the front wall of the external housing, said first mounting point having a threaded accessory receiver for attaching lenses, filters, or adapters, the threaded accessory receiver surrounding an aperture of the optical window assembly; and a second mounting point located on the bottom wall of the external housing and capable of attaching a handle to the outside of the external housing.

2. The external waterproof housing set forth in claim 1 further comprising:

a first flexible seal coupled to the end plate.

3. The external waterproof housing set forth in claim 1 further comprising:

one or more waterproof seals located on the external housing surrounding one or more actuation pins.

4. The external waterproof housing set forth in claim 1 further comprising:

a flexible waterproof seal that surrounds the edge of said end plate to assist in forming a waterproof seal said external housing.

5. The external waterproof housing set forth in claim 1 further comprising:

a lens filter, a lens hood, a lens cap or an adapter.

6. An external waterproof housing for a camera unit, comprising:

an external housing having an internal compartment, a top wall, bottom wall, a front wall, a rear wall, and at least one side wall with a side aperture to receive a removable inner carrier, and a top push button actuator positioned on the top wall of said external housing, a side push button actuator positioned on said at least one side wall of said external housing, and a front push button actuator positioned on the front wall of the external housing, said first, second and third actuators being used for external operation of the camera unit, the camera unit being located in the internal compartment of the external housing;

said front wall of the external housing having an optical window assembly secured thereto and located adjacent a lens of the camera unit, said removable inner carrier being inserted into the internal compartment of the external housing through the side aperture, said removable inner carrier supporting the camera unit located in the internal compartment of the external housing, said removable inner carrier having:

a. a supplemental battery unit and first connector;
b. a supplemental memory storage unit and first memory storage connector;
c. a camera unit closure area;

said camera unit being connected to the supplemental battery unit through first battery connector and said camera unit being connected to the supplemental memory storage unit through the first memory storage connector;

said removable inner carrier having at least one end with an end plate, said end plate secured to said external housing to cover said side aperture, seal the internal compartment, and make the external housing watertight;

a first latch located on the top wall and a second latch located on the bottom wall of the external housing, said first and second latches being positioned over a portion of the end plate and said first and second latches latching, in a waterproof-sealed engagement, the end plate of said removable inner carrier into the side aperture of the external housing; and a first mounting point located on the optical window assembly of the front wall of the external housing, said first mounting point having a threaded accessory receiver for attaching lenses, filters, or adapters, the threaded accessory receiver surrounding an aperture of the optical window assembly.

7. The external waterproof housing set forth in claim 6 further comprising:

a first flexible seal coupled to the end plate.

8. The external waterproof housing set forth in claim 6 further comprising:

one or more waterproof seals located on the external housing and surrounding one or more actuation pins.

9. The external waterproof housing set forth in claim 6 wherein the optical window assembly has a retention ring, an optical lens positioned at the center of the retention ring, a gasket positioned between the retention ring and the optical lens, and an O-ring positioned between the optical lens and the external housing, said optical window assembly secured by a plurality of fasteners to said external housing adjacent an optical window in the front wall of the external housing.

10. The external waterproof housing set forth in claim 6 further comprising:

a lens filter, a lens hood, a lens cap or an adapter.

11. The external waterproof housing set forth in claim 6 further comprising:

a second mounting point located on the bottom wall of the external housing and capable of attaching a handle to the outside of the external housing.

12. An external waterproof housing for a camera unit, comprising:

an external housing having an internal compartment, a top wall, bottom wall, a front wall, a rear wall, and at least one side wall with a side aperture to receive a removable inner carrier, and a top push button actuator positioned on the top wall of said external housing, a side push button actuator positioned on said at least one side wall of said external housing, and a front push button actuator positioned on the front wall of the external housing, said first, second and third actuators being used for external operation of the camera unit, the camera unit being located in the internal compartment of the external housing;

said removable inner carrier being inserted into the internal compartment of the external housing through the side aperture, said removable inner carrier supporting the camera unit located in the internal compartment of the external housing, said removable inner carrier having:
- a. a supplemental battery unit and first battery connector;
- b. a supplemental memory storage unit and first memory storage connector; and
- c. a camera unit closure area;

said camera unit being connected to the supplemental battery unit through first battery connector and said camera unit being connected to the supplemental memory storage unit through the first memory storage connector; and a mounting point located on the front wall of the external housing for mounting lenses, filters or adapters to the front wall of the external housing.

13. The external waterproof housing set forth in claim 12 further comprising:
a first latch located on the top wall and a second latch located on the external housing for latching, in a waterproof-sealed engagement, the end plate of the removable inner carrier.

14. The external waterproof housing set forth in claim 12 further comprising:
a first flexible seal coupled to the end plate of the removable.

15. The external waterproof housing set forth in claim 12 further comprising:
one or more waterproof seals located on the external housing and surrounding one or more actuation pins.

16. The external waterproof housing set forth in claim 12 further comprising:
an optical window assembly having a retention ring, an optical lens positioned at the center of the retention ring, a gasket positioned between the retention ring and the optical lens, and an O-ring positioned between the optical lens and the front wall of the external housing, said optical window assembly secured by a plurality of fasteners to the front wall of the external housing.

17. The external waterproof housing set forth in claim 12 wherein said push button actuation enclosures are positioned on a top, a front and a side of the external housing for external operation of the camera unit.

18. The external waterproof housing set forth in claim 12 further comprising:
a threaded accessory receiver for attaching lenses, filters, or adapters, the threaded accessory receiver surrounding an aperture of an optical window assembly.

* * * * *

UNITED STATES PATENT AND TRADEMARK OFFICE
CERTIFICATE OF CORRECTION

| | |
|---|---|
| PATENT NO. | : 10,101,637 B2 |
| APPLICATION NO. | : 15/261804 |
| DATED | : October 16, 2018 |
| INVENTOR(S) | : Tim Peddecord et al. |

It is certified that error appears in the above-identified patent and that said Letters Patent is hereby corrected as shown below:

In the Claims

Claim 1, Line 37 (Column 11, Line 2), after "through", insert --the--
Claim 4, Line 4 (Column 11, Line 37), after "seal", insert --on--
Claim 6, Line 27 (Column 12, Line 1), delete "closure" and insert --enclosure--
Claim 6, Line 29 (Column 12, Line 3), after "through", insert --the--
Claim 12, Line 25 (Column 13, Line 8), delete "closure" and insert --enclosure--
Claim 12, Line 27 (Column 13, Line 10), after "through", insert --the--
Claim 14, Line 4 (Column 14, Line 2), after "removable", insert --inner carrier--

Signed and Sealed this
Eleventh Day of December, 2018

Andrei Iancu
*Director of the United States Patent and Trademark Office*